US009164341B2

(12) United States Patent
Moriya et al.

(10) Patent No.: US 9,164,341 B2
(45) Date of Patent: Oct. 20, 2015

(54) ACTIVE MATRIX SUBSTRATE, LIQUID CRYSTAL DISPLAY DEVICE AND METHOD FOR MANUFACTURING ACTIVE MATRIX SUBSTRATE

(71) Applicant: Sharp Kabushiki Kaisha, Osaka-shi, Osaka (JP)

(72) Inventors: Yoshimizu Moriya, Osaka (JP); Noboru Nakanishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 14/358,256

(22) PCT Filed: Nov. 12, 2012

(86) PCT No.: PCT/JP2012/079258
§ 371 (c)(1),
(2) Date: May 15, 2014

(87) PCT Pub. No.: WO2013/073495
PCT Pub. Date: May 23, 2013

(65) Prior Publication Data
US 2014/0375921 A1    Dec. 25, 2014

(30) Foreign Application Priority Data

Nov. 18, 2011    (JP) .................................. 2011-253341

(51) Int. Cl.
  *G02F 1/1362* (2006.01)
  *G02F 1/1343* (2006.01)
  *H01L 27/12* (2006.01)

(52) U.S. Cl.
  CPC .... *G02F 1/136286* (2013.01); *G02F 1/136227* (2013.01); *H01L 27/124* (2013.01);
  (Continued)

(58) Field of Classification Search
  CPC .............. G02F 2001/134372; G02F 1/136286; G02F 1/136227; G02F 2001/13629; G02F 2201/40; H01L 27/1259; H01L 27/124; H01L 27/1248
  See application file for complete search history.

(56) References Cited

U.S. PATENT DOCUMENTS 6,646,707 B2    11/2003    Noh et al.
6,977,704 B2    12/2005    Kataoka
(Continued)

FOREIGN PATENT DOCUMENTS

JP    2000-174128 A    6/2000
JP    2002-182230 A    6/2002
(Continued)

OTHER PUBLICATIONS

English translation of Official Communication issued in corresponding International Application PCT/JP2012/079258, mailed on May 30, 2014. (Preliminary Report).
(Continued)

*Primary Examiner* — Dennis Y Kim
(74) *Attorney, Agent, or Firm* — Keating & Bennett, LLP

(57) ABSTRACT

An active matrix substrate (100A) includes a thin film transistor (20), a scanning line (11) substantially parallel to a first direction, a signal line (12) substantially parallel to a second direction which is orthogonal to the first direction, a first interlayer insulating layer (16) covering the thin film transistor, a lower layer electrode (17) provided on the first interlayer insulating layer, a dielectric layer (18) provided on the lower layer electrode, and an upper layer electrode (19) overlapping at least a portion of the lower layer electrode via the dielectric layer. A first contact hole (31) for allowing the upper layer electrode to be electrically connected to a drain electrode (24) of the thin film transistor includes a first aperture (16a) formed in the first interlayer insulating layer and a second aperture (18a) formed in the dielectric layer. A width of the first aperture along one of the first direction and the second direction is smaller than a width of the second aperture along the one direction. When viewed from the normal direction of the substrate, a portion of the contour of the second aperture is located inside the contour of the first aperture.

16 Claims, 19 Drawing Sheets

(52) U.S. Cl.
CPC ........ *H01L27/1248* (2013.01); *H01L 27/1259* (2013.01); *G02F 2001/13629* (2013.01); *G02F 2001/134372* (2013.01); *G02F 2201/40* (2013.01)

(56) References Cited

U.S. PATENT DOCUMENTS

| | | |
|---|---|---|
| 2004/0239857 A1 | 12/2004 | Yoshikawa |
| 2011/0050551 A1 | 3/2011 | Ota et al. |
| 2012/0268396 A1* | 10/2012 | Kim et al. ............ 345/173 |

FOREIGN PATENT DOCUMENTS

| | | |
|---|---|---|
| JP | 2002-357830 A | 12/2002 |
| JP | 2004-354496 A | 12/2004 |
| JP | 2011-053443 A | 3/2011 |

OTHER PUBLICATIONS

Official Communication issued in International Patent Application No. PCT/JP2012/079258, mailed on Feb. 5, 2013.

* cited by examiner

FIG.2
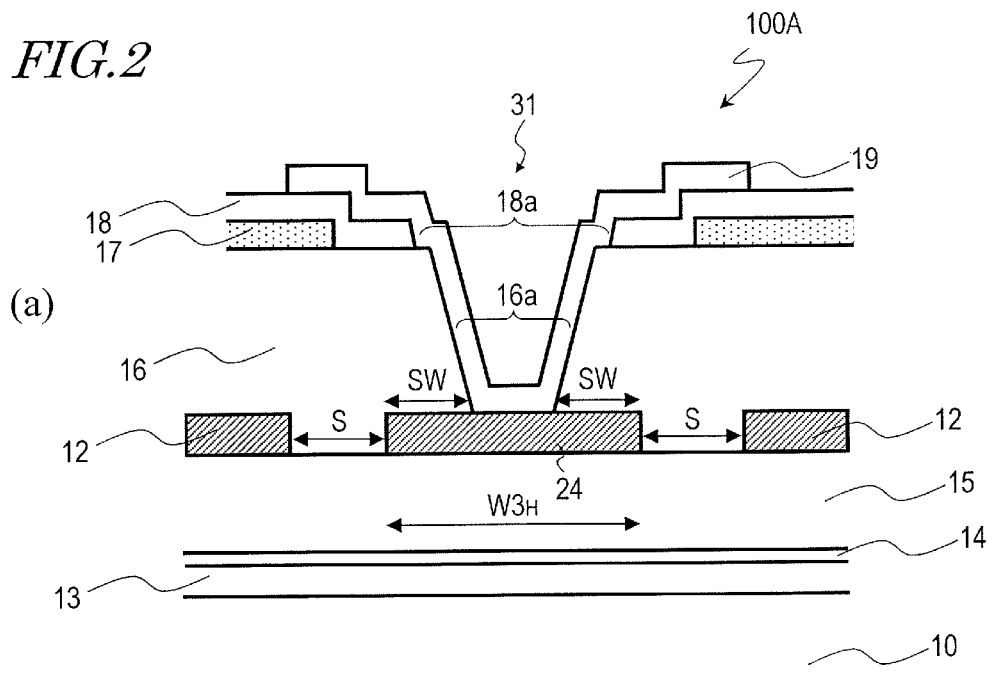
(a)
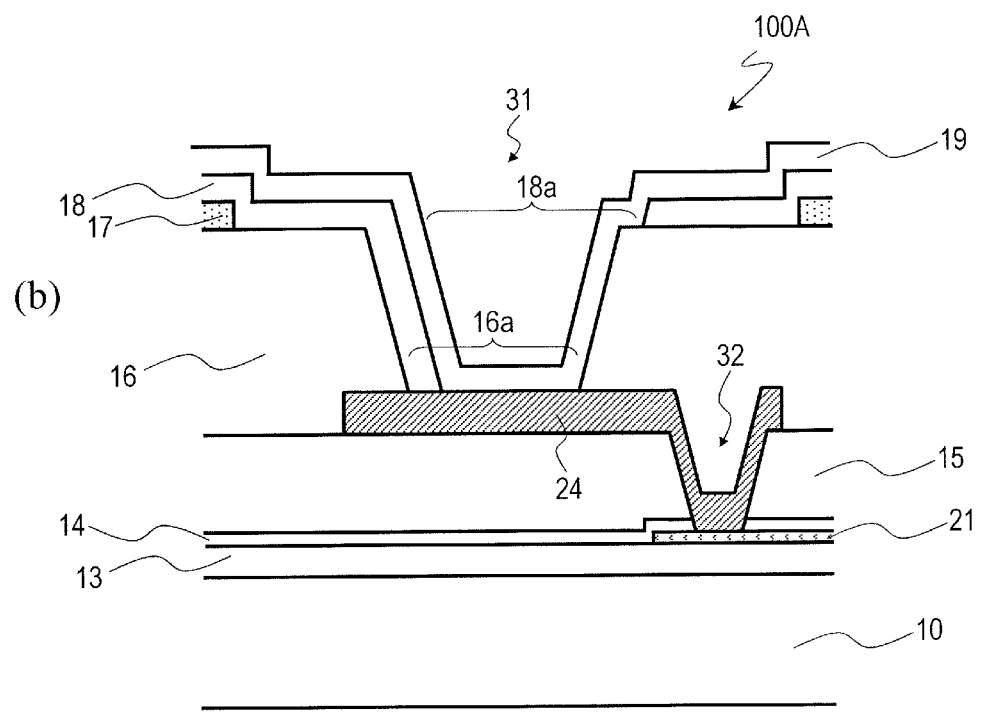
(b)

FIG.4
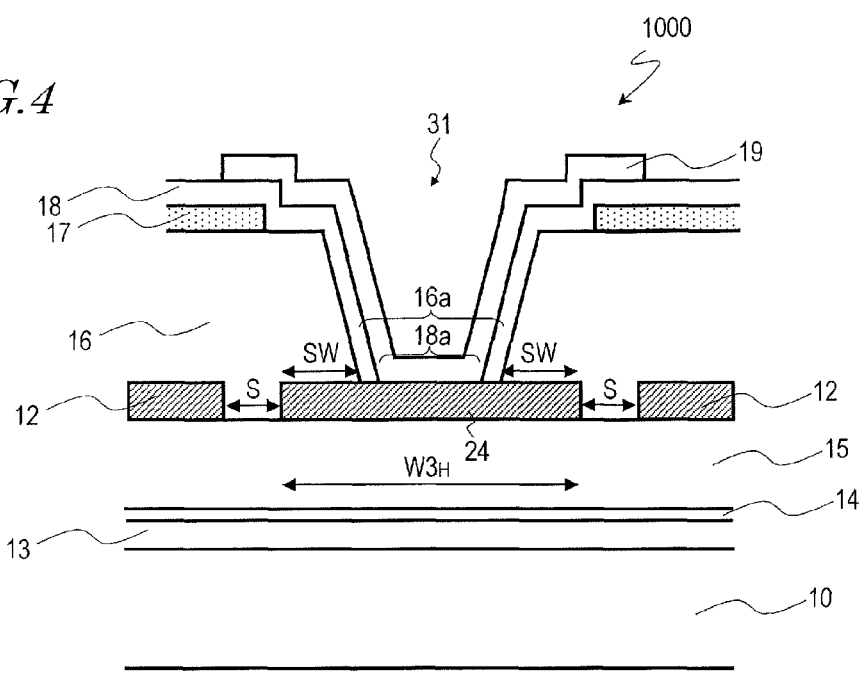
FIG.5
(a1)
(b1)
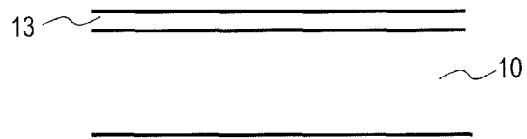
(a2)
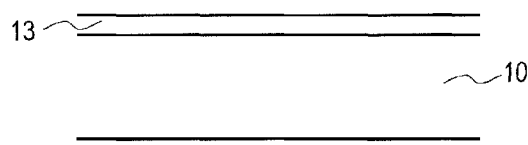
(b2)
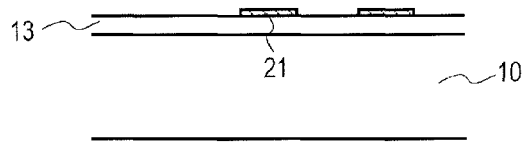
(a3)
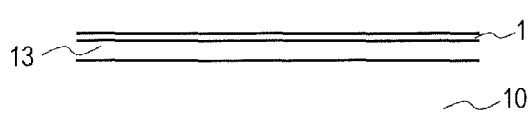
(b3)
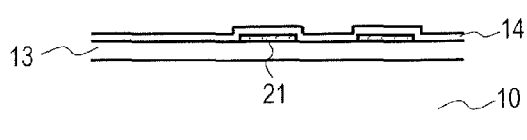

*FIG.6*
(a1)                    (b1)
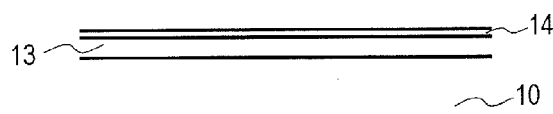    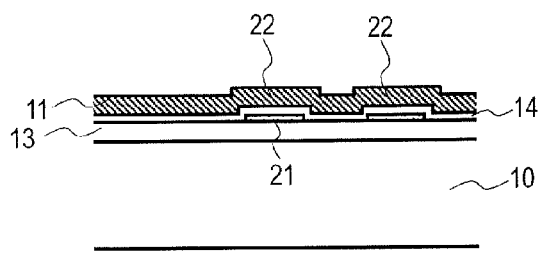
(a2)                    (b2)
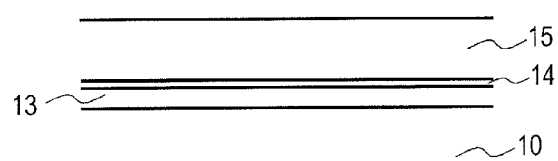    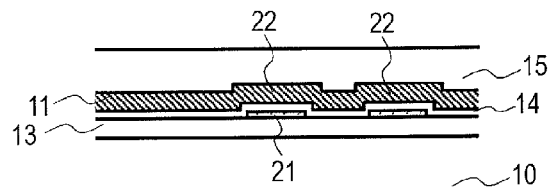
(a3)                    (b3)
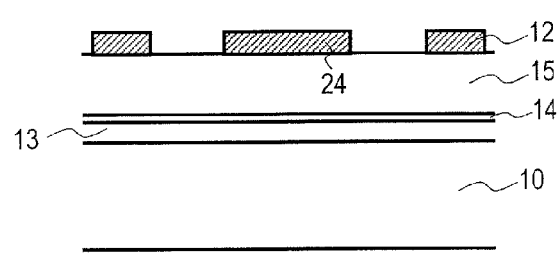    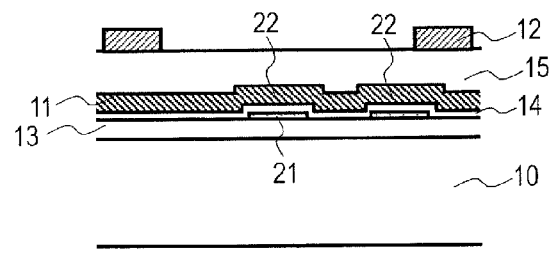

FIG. 7
(a1)
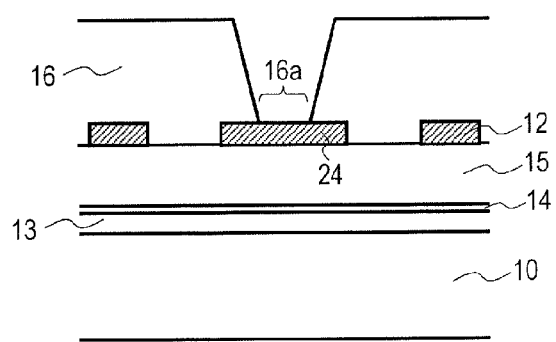
(b1)
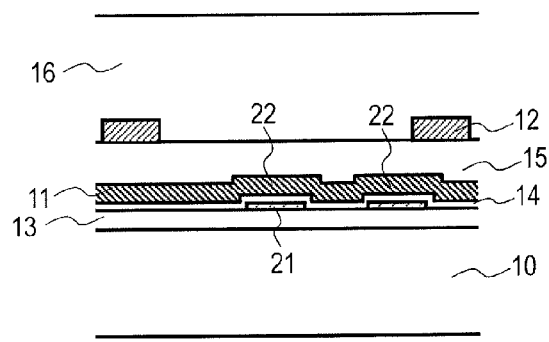
(a2)
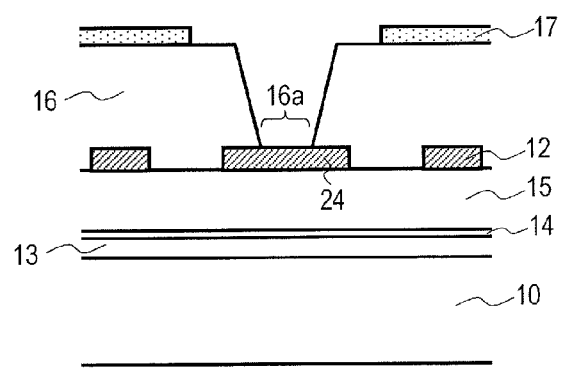
(b2)
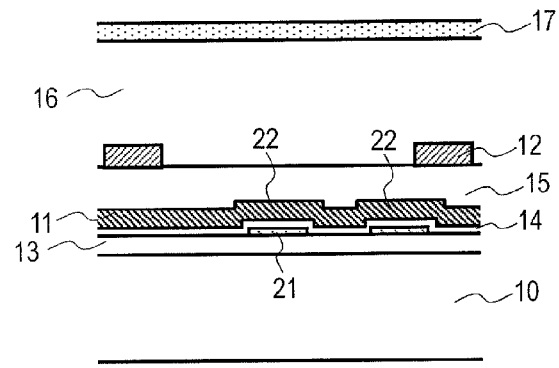

FIG.8
(a1)
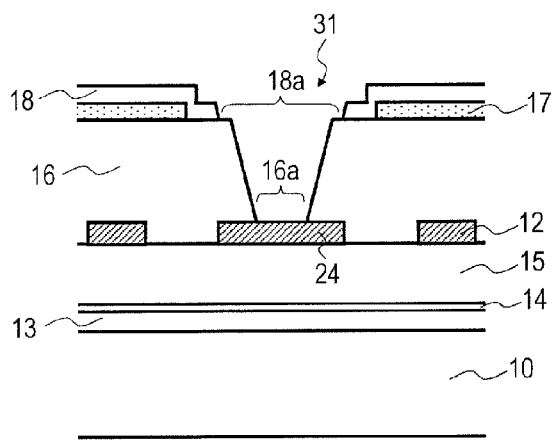
(b1)
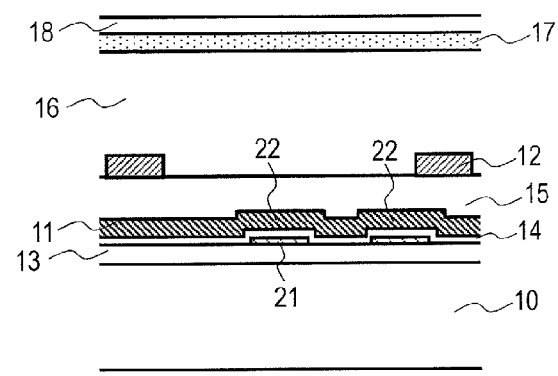
(a2)
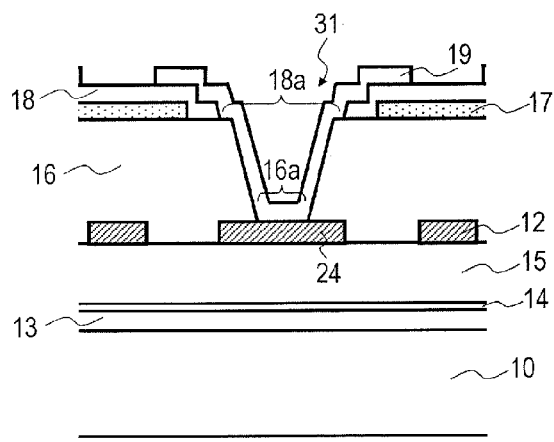
(b2)
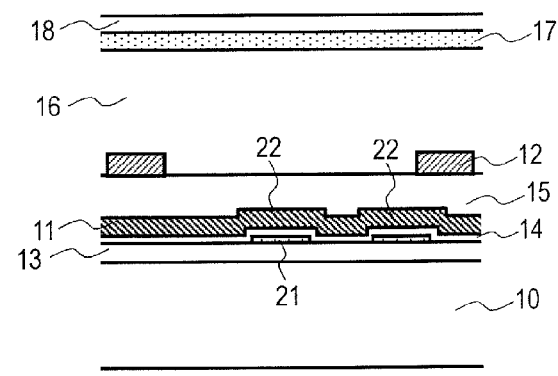

FIG.10
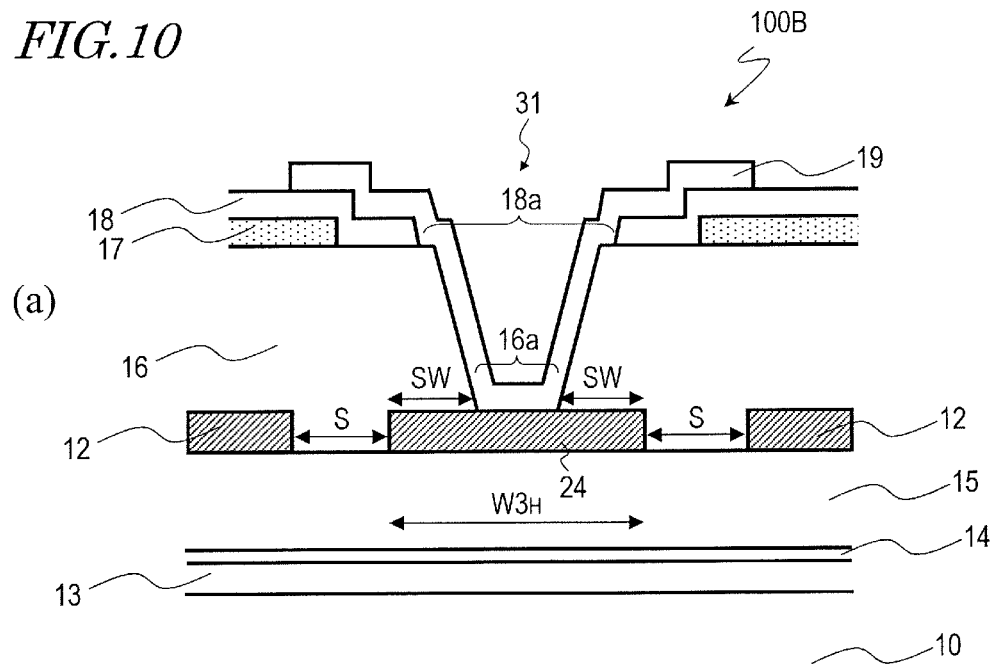
(a)
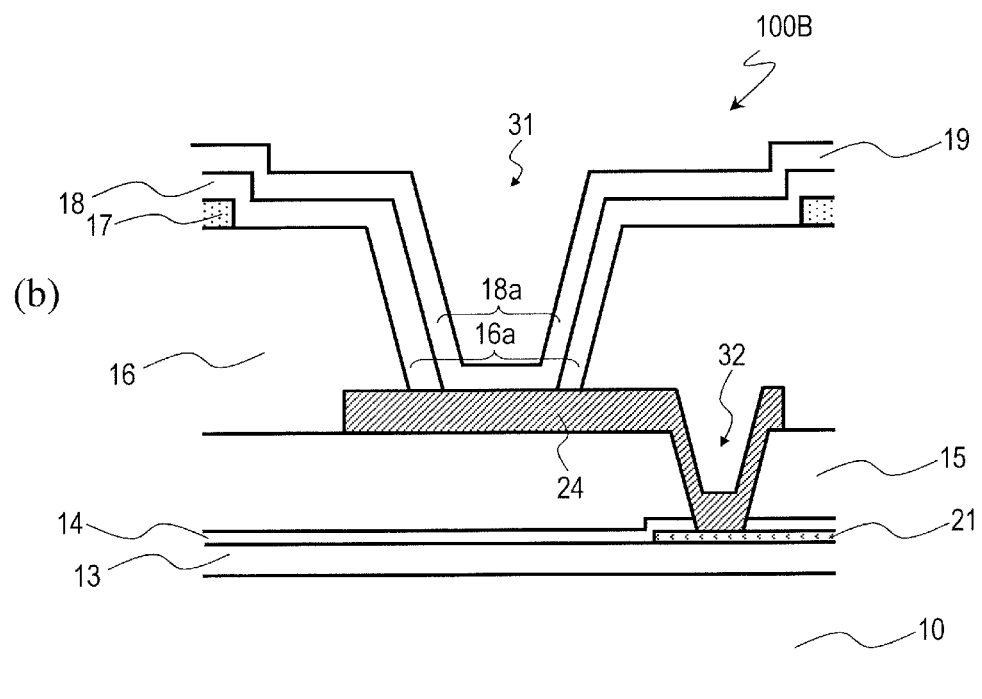
(b)

*FIG.12*
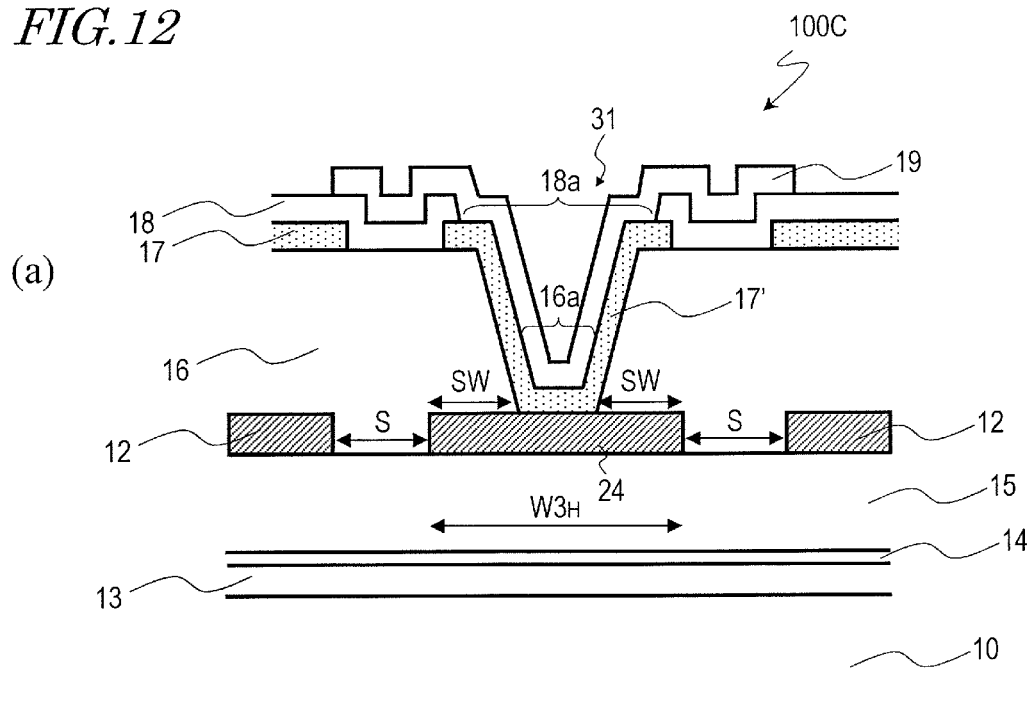
(a)
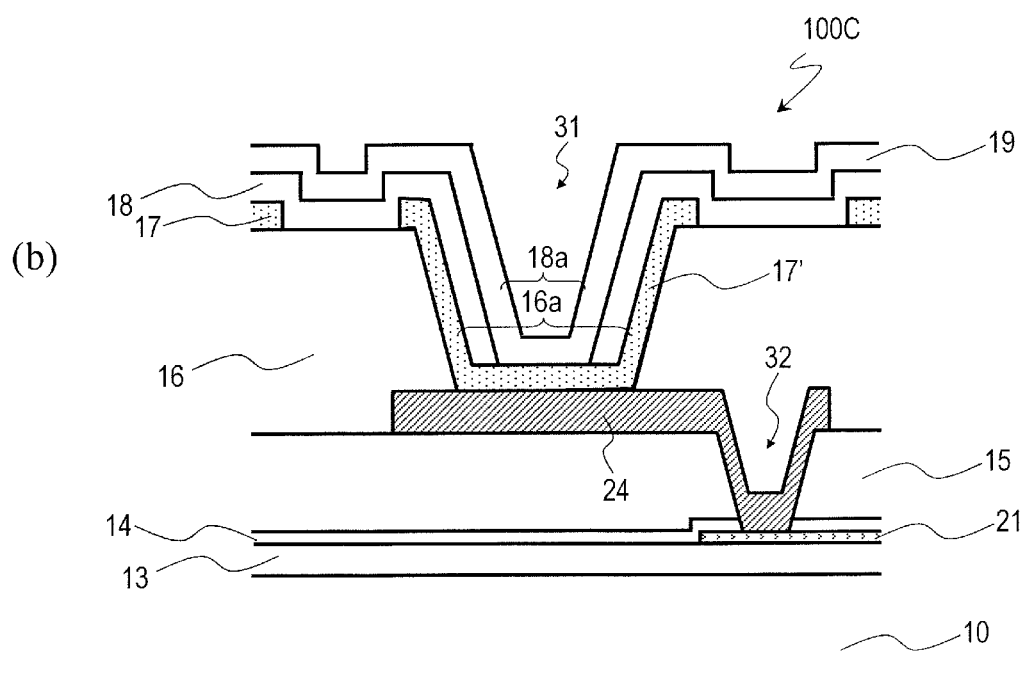
(b)

FIG.14
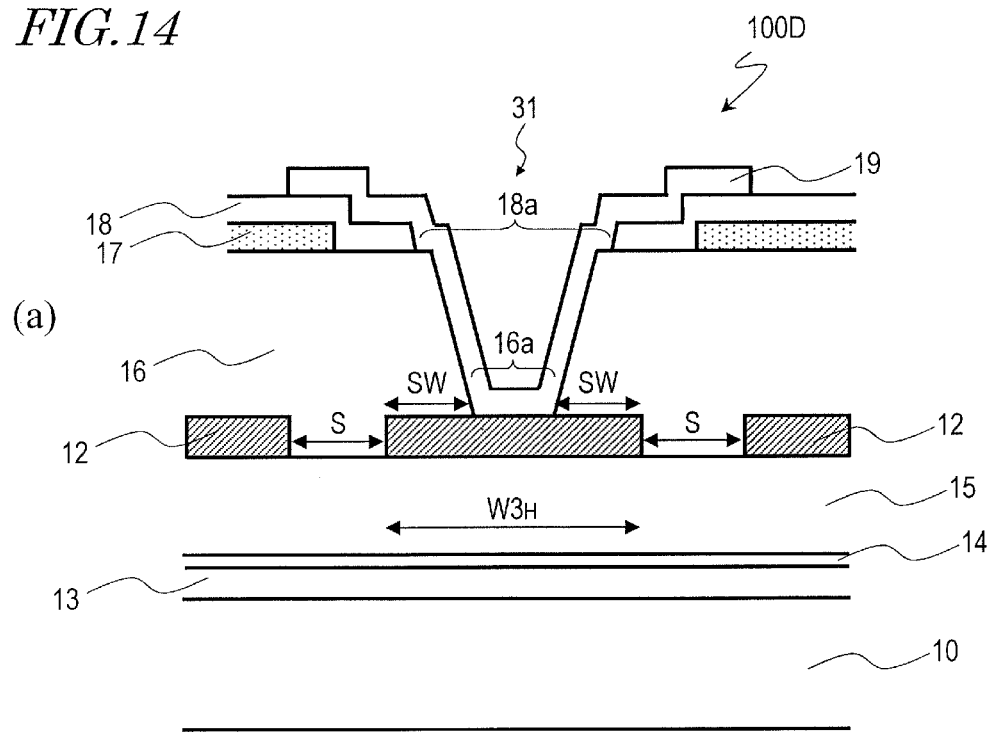
(a)
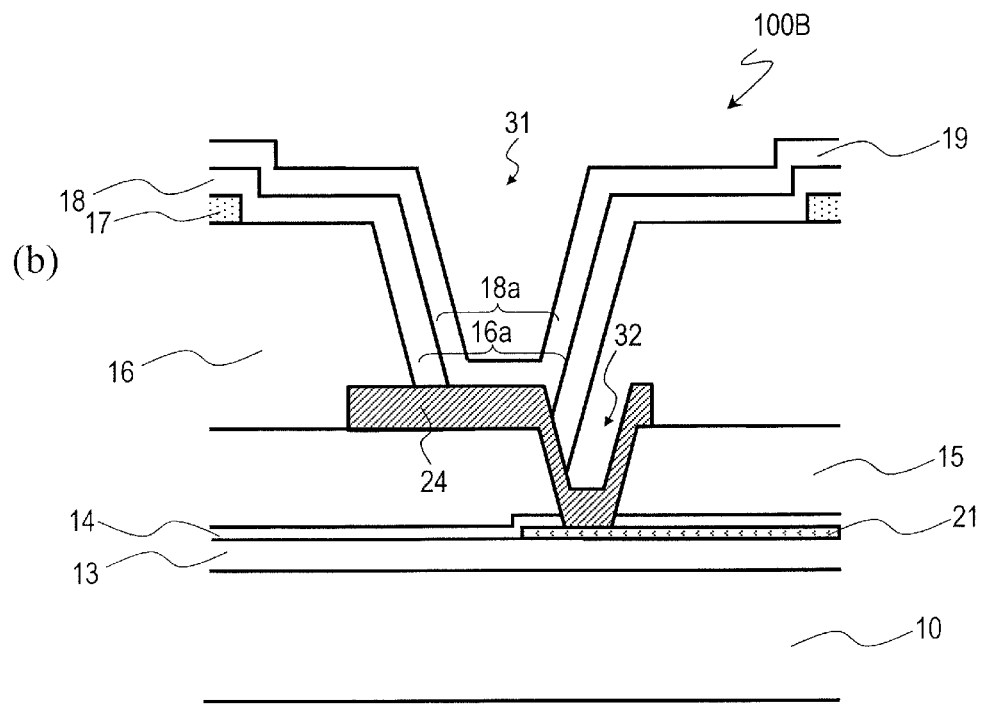
(b)

ACTIVE MATRIX SUBSTRATE, LIQUID CRYSTAL DISPLAY DEVICE AND METHOD FOR MANUFACTURING ACTIVE MATRIX SUBSTRATE

TECHNICAL FIELD

The present invention relates to an active matrix substrate, and more particularly to an active matrix substrate having two-layered electrodes, including an upper layer electrode and a lower layer electrode. Moreover, the present invention relates to a liquid crystal display device having such an active matrix substrate, and a method of producing such an active matrix substrate.

BACKGROUND ART

Liquid crystal display devices, due to their thinness and low power consumption, are broadly used in various fields. In particular, active-matrix type liquid crystal display devices have high performance with a high contrast ratio and excellent response characteristics, and are used for television sets, monitors, and laptop personal computers; they are increasing in market size in the recent years.

Generally speaking, an active-matrix type liquid crystal display device includes an active matrix substrate (also referred to as a "TFT substrate") on which thin film transistors (TFTs) are formed as switching elements corresponding to the respective pixels, a counter substrate (also referred to as a "color filter substrate") on which color filters and the like are formed, and a liquid crystal layer provided between the active matrix substrate and the counter substrate. An electric field which is in accordance with the potential difference between the common electrode and a pixel electrode electrically connected to a thin film transistor is applied across the liquid crystal layer, this electric field causing a change in the alignment state of liquid crystal molecules in the liquid crystal layer, thereby controlling the light transmittance of each pixel to enable displaying.

Depending on the application, various display modes have been proposed and adopted in active-matrix type liquid crystal display devices. Examples of display modes include the TN (Twisted Nematic) mode, the VA (Vertical Alignment) mode, the IPS (In-Plane-Switching) mode, and the FFS (Fringe Field Switching) mode.

In some display modes, a "two-layer electrode structure" is adopted for the active matrix substrate. A two-layer electrode structure includes the following, on an interlayer insulating layer covering thin film transistors: a lower layer electrode(s), a dielectric layer covering the lower layer electrode(s), and an upper layer electrode(s) overlying the lower layer electrode(s) via the dielectric layer. For example, in the commonly-used FFS mode, as is disclosed in Patent Document 1, a common electrode is provided as a lower layer electrode, and pixel electrodes having a plurality of slits formed therein are provided as upper layer electrodes. Both the common electrode and the pixel electrodes are made of a transparent electrically conductive material. As is disclosed in Patent Document 2, a construction is also known for the FFS mode where pixel electrodes are provided as lower layer electrodes, and a common electrode having a plurality of slits formed therein is provided as an upper layer electrode.

For reasons that will be described in detail later, a two-layer electrode structure may possibly be adopted irrespective of the display mode (that is, also in the VA mode and the like).

When adopting a two-layer electrode structure featuring pixel electrodes as upper layer electrodes, in order to electrically connect a pixel electrode to the drain electrode of a thin film transistor, an aperture through which to expose a portion of the drain electrode must be formed in both the interlayer insulating layer covering the thin film transistor and the dielectric layer located between the electrodes. By forming the pixel electrode so as to be in contact with the drain electrode in a contact hole which includes an aperture through the interlayer insulating layer and an aperture through the dielectric layer, the pixel electrode is allowed to be electrically connected to the drain electrode.

In this case, the etching to form the aperture in the dielectric layer will also erode the tapered portion (slanted side face) of the aperture in the interlayer insulating layer, thus allowing the side face shape of the contact hole to become steep. As a result, the pixel electrode, having a relatively small thickness, may become disrupted in the contact hole (called "stepping"). Therefore, in order to avoid insufficient connection due to stepping of the pixel electrode, the aperture in the dielectric layer is formed so that it wholly fits within the aperture in the interlayer insulating layer when viewed from the normal direction of the substrate.

CITATION LIST

Patent Literature

[Patent Document 1] Japanese Laid-Open Patent Publication No. 2002-182230
[Patent Document 2] Japanese Laid-Open Patent Publication No. 2011-53443

SUMMARY OF INVENTION

Technical Problem

However, since the dielectric layer has a large film thickness to be etched, the aperture in the dielectric layer is likely to have a large finished diameter along the plane of the substrate. Therefore, the aperture in the interlayer insulating layer, within which the aperture in the dielectric layer is contained, inevitably needs to have a large diameter, too.

On the other hand, the drain electrode serves not only to provide electrical connection to the pixel electrode, but also to shade regions in which the liquid crystal molecules have disorderly alignment, near the tapered portion of the aperture in the interlayer insulating layer. Therefore, when the aperture in the interlayer insulating layer increases in diameter, the drain electrode size must also be increased.

The drain electrodes are typically in the same layer as the signal lines (that is, they are formed by patterning the same electrically conductive film). Therefore, when a liquid crystal display device having high definition is given a standard pixel construction in which the ratio between the pixel pitch along the horizontal direction and the pixel pitch along the vertical direction (H/V ratio) is 1:3, it is impossible to ensure sufficient intralayer spaces along the horizontal direction if a large drain electrode size exists for the aforementioned reason. This will impose constrains as to definition, thus making manufacture difficult at high definitions. Specifically, manufacture at pixel densities of 370 ppi or more will become difficult.

The present invention has been made in view of the above problems, and an objective thereof is to provide an active matrix substrate which can be produced with a higher definition than conventionally, in spite of having a two-layer electrode structure.

Solution to Problem

An active matrix substrate according to an embodiment of the present invention comprises: a substrate; a thin film transistor being supported by the substrate and including a semiconductor layer, a gate electrode, a source electrode, and a drain electrode; a scanning line provided so as to extend substantially parallel to a first direction, and electrically connected to the gate electrode of the thin film transistor; a signal line provided so as to extend substantially parallel to a second direction orthogonal to the first direction, and electrically connected to the source electrode of the thin film transistor; a first interlayer insulating layer provided so as to cover the thin film transistor; a lower layer electrode provided on the first interlayer insulating layer; a dielectric layer provided on the lower layer electrode; and an upper layer electrode being provided on the dielectric layer and overlapping at least a portion of the lower layer electrode via the dielectric layer, wherein, a first contact hole through which a portion of the drain electrode is exposed is formed in the first interlayer insulating layer and the dielectric layer, the first contact hole allowing the upper layer electrode to be electrically connected to the drain electrode; the first contact hole includes a first aperture formed in the first interlayer insulating layer and a second aperture formed in the dielectric layer; a width of the first aperture along one of the first direction and the second direction is smaller than a width of the second aperture along the one direction; and when viewed from a normal direction of the substrate, a portion of the contour of the second aperture is located inside the contour of the first aperture.

In a preferred embodiment, when viewed from the normal direction of the substrate, the first aperture and the second aperture each have a rectangular contour.

In a preferred embodiment, when viewed from the normal direction of the substrate, the contour of the second aperture includes two sides which are substantially parallel to the one direction, one of the two sides being located partially inside the contour of the first aperture.

In a preferred embodiment, when viewed from the normal direction of the substrate, the contour of the second aperture includes two sides which are substantially parallel to the one direction, both of the two sides being located partially inside the contour of the first aperture.

In a preferred embodiment, a width of the first aperture along the other of the first direction and the second direction is greater than a width of the second aperture along the other direction.

In a preferred embodiment, in the first contact hole, the upper layer electrode is in contact with the drain electrode.

In a preferred embodiment, the active matrix substrate according to the present invention further comprises a connection electrode made of a same electrically conductive film as the lower layer electrode, wherein the connection electrode is in contact with the drain electrode within the first contact hole, the upper layer electrode being in contact with the connection electrode.

In a preferred embodiment, the active matrix substrate according to the present invention further comprises: a gate insulating layer provided between the semiconductor layer and the gate electrode; and a second interlayer insulating layer provided so as to cover the gate electrode or the semiconductor layer, wherein, between the gate insulating layer and the second interlayer insulating layer, at least the second interlayer insulating layer has a second contact hole formed therein through which a portion of the semiconductor layer is exposed, the second contact hole allowing the drain electrode to be electrically connected to the semiconductor layer; and when viewed from the normal direction of the substrate, at least a portion of the second contact hole overlaps the first contact hole.

In a preferred embodiment, when viewed from the normal direction of the substrate, a center of the first contact hole and a center of the second contact hole are deviated.

In a preferred embodiment, the upper layer electrode and the lower layer electrode are each made of a transparent electrically conductive material.

In a preferred embodiment, a width of the first aperture along the first direction is smaller than a width of the second aperture along the first direction.

A liquid crystal display device according to the present invention comprises: the active matrix substrate of the above construction; a counter substrate provided opposite from the active matrix substrate; and a liquid crystal layer proved between the active matrix substrate and the counter substrate.

In a preferred embodiment, the liquid crystal display device according to the present invention has a plurality of pixels in a matrix arrangement, wherein the upper layer electrode functions as a pixel electrode.

In a preferred embodiment, the upper layer electrode has a plurality of slits.

In a preferred embodiment, the lower layer electrode, the dielectric layer, and the upper layer electrode constitute a storage capacitor.

In a preferred embodiment, a liquid crystal display device according to the present invention performs displaying in the VA mode.

In a preferred embodiment, a liquid crystal display device according to the present invention performs displaying in the FFS mode.

A method of producing an active matrix substrate according to an embodiment of the present invention is a method of producing an active matrix substrate including: a thin film transistor including a semiconductor layer, a gate electrode, a source electrode, and a drain electrode; a scanning line provided so as to extend substantially parallel to a first direction, and electrically connected to the gate electrode of the thin film transistor; and a signal line provided so as to extend substantially parallel to a second direction orthogonal to the first direction, and electrically connected to the source electrode of the thin film transistor, the method comprising: step (A) of forming the thin film transistor on a substrate; step (B) of forming an interlayer insulating layer covering the thin film transistor, the interlayer insulating layer having a first aperture; step (C) of forming a lower layer electrode on the interlayer insulating layer; step (D) of forming on the lower layer electrode a dielectric layer having a second aperture; and step (E) of forming on the dielectric layer an upper layer electrode overlapping at least a portion of the lower layer electrode via the dielectric layer, the upper layer electrode being electrically connected to the drain electrode in a contact hole, the contact hole including the first aperture and the second aperture, wherein, step (B) and step (D) are performed so that a width of the first aperture along one of the first direction and the second direction is smaller than a width of the second aperture along the one direction, and that, when viewed from a normal direction of the substrate, a portion of the contour of the second aperture is located inside the contour of the first aperture.

Advantageous Effects of Invention

According to an embodiment of the present invention, there is provided an active matrix substrate which can be produced with a higher definition than conventionally, in spite of having a two-layer electrode structure.

BRIEF DESCRIPTION OF DRAWINGS

FIG. 2 A diagram schematically showing the active matrix substrate 100A according to a preferred embodiment of the present invention, where (a) is a cross-sectional view taken along line 2A-2A' in FIGS. 1, and (b) is a cross-sectional view taken along line 2B-2B' in FIG. 1.

FIG. 4 A schematically showing the active matrix substrate 1000 according to Comparative Example, as a cross-sectional view taken along line 4A-4A' in FIG. 3.

FIG. 5 Step-by-step cross-sectional views showing a method of producing the active matrix substrate 100A, where (a1) to (a3) correspond to a cross section taken along line 2A-2A' in FIGS. 1, and (b1) to (b3) correspond to a cross section taken along line 5B-5B' in FIG. 1.

FIG. 6 Step-by-step cross-sectional views showing a method of producing the active matrix substrate 100A, where (a1) to (a3) correspond to a cross section taken along line 2A-2A' in FIGS. 1, and (b1) to (b3) correspond to a cross section taken along line 5B-5B' in FIG. 1.

FIG. 7 Step-by-step cross-sectional views showing a method of producing the active matrix substrate 100A, where (a1) and (a2) correspond to a cross section taken along line 2A-2A' in FIGS. 1, and (b1) and (b2) correspond to a cross section taken along line 5B-5B' in FIG. 1.

FIG. 8 Step-by-step cross-sectional views showing a method of producing the active matrix substrate 100A, where (a1) and (a2) correspond to a cross section taken along line 2A-2A' in FIGS. 1, and (b1) and (b2) correspond to a cross section taken along line 5B-5B' in FIG. 1.

FIG. 10 A diagram schematically showing the active matrix substrate 100B according to a preferred embodiment of the present invention, where (a) is a cross-sectional view taken along line 10A-10A' in FIGS. 9, and (b) is a cross-sectional view taken along line 10B-10B' in FIG. 9.

FIG. 12 A diagram schematically showing the active matrix substrate 100C according to a preferred embodiment of the present invention, where (a) is a cross-sectional view taken along line 12A-12A' in FIG. 11, (b) is a cross-sectional view taken along line 12B-12B' in FIG. 11.

FIG. 14 A diagram schematically showing the active matrix substrate 100D according to a preferred embodiment of the present invention, where (a) is a cross-sectional view taken along line 14A-14A' in FIGS. 13, and (b) is a cross-sectional view taken along line 14B-14B' in FIG. 13.

DESCRIPTION OF EMBODIMENTS

Hereinafter, embodiments of the present invention will be described with reference to the drawings. Note that the present invention is not limited to the following embodiments.

Embodiment 1

Figure 1:
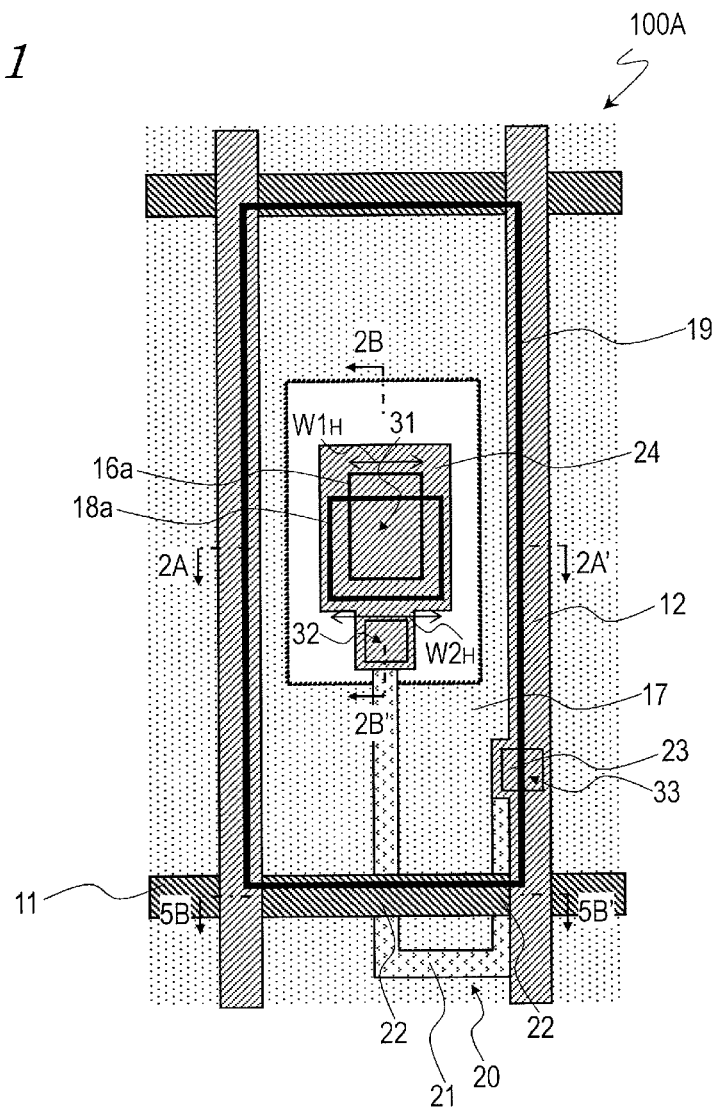
FIG. 1 A diagram schematically showing an active matrix substrate 100A according to a preferred embodiment of the present invention, as a plan view showing a region corresponding to one pixel.

FIG. 1 and FIG. 2 show an active matrix substrate 100A according to the present embodiment. FIG. 1 is a plan view schematically showing the active matrix substrate 100A, and FIGS. 2(a) and (b) are cross-sectional views taken along line 2A-2A' and line 2B-2B' in FIG. 1, respectively.

The active matrix substrate 100A is used for a liquid crystal display device which performs displaying in the VA mode. The liquid crystal display device includes a plurality of pixels in a matrix arrangement. FIG. 1 shows a region corresponding to one pixel of the liquid crystal display device.

As shown in FIG. 1 and FIGS. 2(a) and (b), the active matrix substrate 100A includes a substrate 10, thin film transistors (TFTs) 20, scanning lines 11, and signal lines 12.

The substrate 10 is transparent and insulative. The substrate 10 is typically a glass substrate.

The TFTs 20 are supported on the substrate 10. Each TFT 20 includes a semiconductor layer 21, gate electrodes 22, a source electrode 23, and a drain electrode 24. In the present embodiment, the TFTs 20 are top-gate type TFTs. Moreover, each TFT 20 has a so-called double gate structure, including two gates (i.e., two gate electrodes 22 are provided).

The scanning lines (also referred to as "gate bus lines") 11 are provided so as to extend substantially parallel to a certain direction (first direction). In the present embodiment, the first direction is the horizontal direction on the display surface of the liquid crystal display device. The scanning lines 11 are electrically connected to the gate electrodes 22 of the TFT 20.

The signal lines (also referred to as "source bus lines") 12 are provided so as to extend substantially parallel to a direction (second direction) which is orthogonal to the first direction. In the present embodiment, the second direction is the vertical direction of the display surface of the liquid crystal display device. The signal lines 12 are electrically connected to the source electrodes of the TFTs 20.

A basecoat layer 13 is formed on the surface of the substrate 10, such that the semiconductor layer 21 of the TFTs 20 is provided upon the basecoat layer 13. As the material of the semiconductor layer 21, various known semiconductor materials can be used; for example, amorphous silicon, polycrystalline silicon, continuous grain silicon (CGS), or the like can be used. Alternatively, an oxide semiconductor such as an In—Ga—Zn—O type semiconductor (IGZO) may also be used.

A gate insulating layer 14 is formed so as to cover the semiconductor layer 21, such that the scanning lines 11 and the gate electrodes 22 are provided upon the gate insulating layer 14. In other words, the gate insulating layer 14 is provided between the semiconductor layer 21 and the gate electrodes 22. In the present embodiment, the portions of the scanning lines 11 that overlap the semiconductor layer 21 function as the gate electrodes 22.

An interlayer insulating layer 15 is provided so as to cover the scanning lines 11 and the gate electrodes 22, such that the signal lines 12, the source electrodes 23, and the drain electrodes 24 are provided upon the interlayer insulating layer 15. In the gate insulating layer 14 and the interlayer insulating layer 15, contact holes 32 and 33 through which portions of the semiconductor layer 21 are exposed are formed. The former contact holes 32 allow the drain electrodes 24 to be electrically connected to the semiconductor layer 21. In the present embodiment, a drain electrode 24 achieves contact with the semiconductor layer 21 in each contact hole 32, whereby the semiconductor layer 21 and the drain electrode 24 are electrically connected to each other. The latter contact holes 33 allow the source electrodes 23 to be electrically connected to the semiconductor layer 21. In the present embodiment, a source electrode 23 achieves contact with the semiconductor layer 21 in each contact hole 33, whereby the semiconductor layer 21 and the source electrode 23 are electrically connected to each other.

As shown in FIG. 1 and FIGS. 2(*a*) and (*b*), the active matrix substrate 100A further includes an interlayer insulating layer 16, a lower layer electrode 17, a dielectric layer 18, and upper layer electrodes 19.

The interlayer insulating layer 16 is provided so as to cover the TFTs 20. More specifically, the interlayer insulating layer 16 is formed on the signal lines 12, the source electrodes 23, the drain electrodes 24, and the like. Hereinafter, the interlayer insulating layer 16, which takes a relatively upper position, is referred to as the "first interlayer insulating layer", whereas the interlayer insulating layer 15, which takes a relatively lower position, is referred to as the "second interlayer insulating layer".

The lower layer electrode 17 is provided on the first interlayer insulating layer 16. The lower layer electrode 17 is formed continuously over all pixels. However, the lower layer electrode 17 is not formed near contact holes 31, which will be described later.

The dielectric layer 18 is provided on the lower layer electrode 17.

The upper layer electrodes 19 are provided on the dielectric layer 18. The upper layer electrodes 19 overlap at least portions of the lower layer electrode 17 via the dielectric layer 18. The upper layer electrodes 19 are formed independently (in isolated forms) for the respective pixels. In the present embodiment, an upper layer electrode 19 accounts for substantially the entirety of each pixel, thus constituting a so-called spread electrode in which no slits or apertures are formed. Moreover, the upper layer electrodes 19 are electrically connected to the drain electrodes 24 of the TFTs 20, so that display signal voltages are supplied thereto from the signal lines 11, via the TFTs 20. In other words, the upper layer electrodes 19 function as the pixel electrodes.

On the other hand, the lower layer electrode 17 has a storage capacitor voltage (Cs voltage) supplied thereto, thus functioning as a storage capacitor line and a storage capacitor electrode. In other words, the lower layer electrode 17 and upper layer electrodes 19, and the dielectric layer 18 interposed therebetween, constitute a storage capacitor. The upper layer electrodes 19 functioning as the pixel electrodes and the lower layer electrode 17 functioning as the storage capacitor electrode are each made of a transparent electrically conductive material (e.g., ITO).

In the first interlayer insulating layer 16 and the dielectric layer 18, contact holes 31 are formed, through which portions of the drain electrodes 24 are exposed. The contact holes 31 allow the upper layer electrodes 19 to be electrically connected to the drain electrodes 24. In the present embodiment, the upper layer electrodes 19 achieve contact with the drain electrode 24 in the contact hole 31, whereby the drain electrodes 24 and the upper layer electrodes 19 are electrically connected to one another.

Hereinafter, the contact hole 31 for allowing the upper layer electrodes 19 to be electrically connected to the drain electrodes 24 will be referred to as the "first contact holes". On the other hand, the contact hole 32 for allowing the drain electrodes 24 to be electrically connected to the semiconductor layer 21 will be referred to as "second contact holes", whereas the contact holes 33 for allowing the source electrodes 23 to be electrically connected to the semiconductor layer 21 will be referred to as "third contact holes".

Each first contact hole 31 includes a first aperture 16*a* formed in the first interlayer insulating layer 16 and a second aperture 18*a* formed in the dielectric layer 18. In the present embodiment, when viewed from the normal direction of the substrate 10, the first aperture 16*a* and the second aperture 18*a* each have a rectangular contour.

As shown in FIG. 1, a width $W1_H$ of the first aperture 16*a* along the horizontal direction (first direction) is smaller than a width $W2_H$ of the second aperture 18*a* along the horizontal direction. In other words, among the four sides constituting the contour of the first aperture 16*a*, the two sides which are substantially parallel to the horizontal direction are shorter than the two sides among the four sides constituting the contour of the second aperture 18*a* which are substantially parallel to the horizontal direction.

Moreover, when viewed from the normal direction of the substrate 10, a portion of the contour of the second aperture 18*a* is located inside the contour of the first aperture 16*a*. More specifically, among the contour of the second aperture 18*a*, one of the two sides which are substantially parallel to the horizontal direction (i.e., the upper side herein) is located partially inside the contour of the first aperture 16*a*. Thus, the contour of the second aperture 18*a* and the contour of the first aperture 16*a* intersect each other.

Because of the aforementioned shapes and positioning of the first aperture 16*a* in the first interlayer insulating layer 16 and the second aperture 18*a* in the dielectric layer 18, the active matrix substrate 100A of the present embodiment improves the definition up to which manufacture is possible, so that manufacture at a high definition than conventional is possible. Hereinafter, the reasons therefor will be described with reference to Comparative Example.

Figure 3:
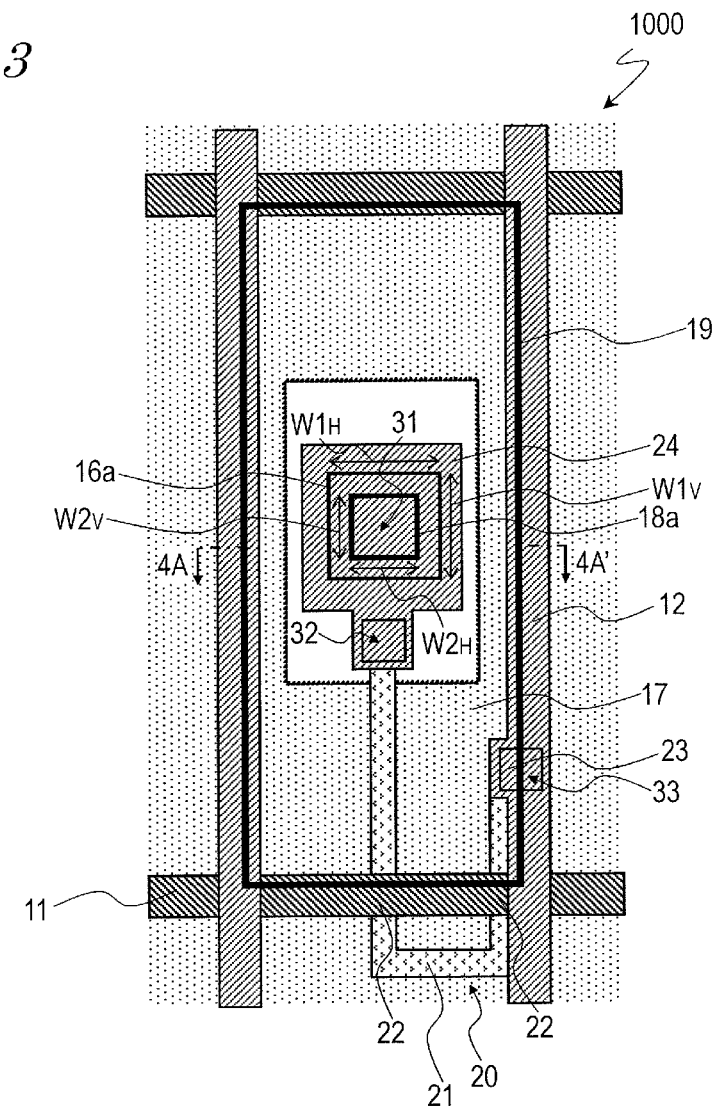
FIG. 3 A schematically showing an active matrix substrate 1000 according to Comparative Example, as a plan view showing a region corresponding to one pixel.

FIG. 3 and FIG. 4 show an active matrix substrate 1000 according to Comparative Example. FIG. 3 is a plan view schematically showing the active matrix substrate 1000, and FIG. 4 is a cross-sectional view taken along line 4A-4A' in FIG. 3.

In the active matrix substrate 1000 according to Comparative Example, the shapes and positioning of the first aperture 16a in the first interlayer insulating layer 16 and the second aperture 18a in the dielectric layer 18 are different from the shapes and positioning of the first aperture 16a and the second aperture 18a of the active matrix substrate 100A of the present embodiment.

In the active matrix substrate 1000, in order to avoid insufficient connection arising from stepping of the upper layer electrodes 19, as shown in FIG. 3 and FIG. 4, the second aperture 18a in the dielectric layer 18 is formed so that its entirety is located within the first aperture 16a in the first interlayer insulating layer 16 when viewed from the normal direction of the substrate 10. In other words, the entire contour of the second aperture 18a is located inside the contour of the first aperture 16a. Therefore, not only is the width $W1_V$ of the first aperture 16a along the vertical direction (second direction) greater than the width $W2_V$ of the second aperture 18a along the vertical direction, but also the width $W1_H$ of the first aperture 16a along the horizontal direction (first direction) is greater than the width $W2_H$ of the second aperture 18a along the horizontal direction.

Therefore, in order to shade the neighborhood of the tapered portion of the first aperture 16a across an appropriate light-shielding width (i.e., the distance from the contour of the first aperture 16a to the outer edge of the drain electrode 24) SW, it is necessary to also increase the width $W3_H$ of the drain electrode 24 along the horizontal direction. Therefore, in the case where a standard pixel construction with a 1:3 ratio (H/V ratio) between the pixel pitch along the horizontal direction and the pixel pitch along the vertical direction is adopted, it becomes no longer possible to sufficiently secure intralayer spaces S along the horizontal direction as the definition increases. Therefore, the active matrix substrate 1000 according to Comparative Example is limited with respect to definition, such that manufacture at a high definition is difficult. Specifically, manufacture at a pixel density of 370 ppi or above becomes difficult.

On the other hand, in the active matrix substrate 100A of the present embodiment, the width $W1_H$ of the first aperture 16a along the horizontal direction (first direction) is smaller than the width $W2_H$ of the second aperture 18a along the horizontal direction. Therefore, while securing the same light-shielding width SW as conventionally (i.e., without a decrease in the contrast ratio caused by disorderly alignment), the width $W3_H$ of the drain electrode 24 along the horizontal direction can be reduced. This makes it possible to secure sufficient intralayer spaces S, such that the definition up to which manufacture is possible (i.e., an upper limit value below which leak defects within the same layer would not be increased) can be increased. Specifically, manufacture is sufficiently possible even when the pixel density is increased to about 450 ppi.

Note that, in a cross section where the first aperture 16a has a smaller width than the width of the second aperture 18a (i.e., a cross section shown in FIG. 2(a) where $W1_H<W2_H$), the upper layer electrodes 19 may experience stepping due to the side face shape of the first contact hole 31 becoming steep. However, in the active matrix substrate 100A of the present embodiment, a portion of the contour of the second aperture 18a is located inside the contour of the first aperture 16a, whereby stepping of the upper layer electrodes 19 is suppressed in a cross section where the contour of the second aperture 18a is located inside the contour of the first aperture 16a (i.e., a cross section shown in FIG. 2(b)). In FIG. 2(b), the left side face shape of the first contact hole 31 is the same as that of the active matrix substrate 1000 according to Comparative Example. Therefore, beginning from that portion (the portion of the contour of the second aperture 18a that is located inside the contour of the first aperture 16a; which herein is part of the upper side of the contour of the second aperture 18a), a sufficient area of contact between each upper layer electrode 19 and each drain electrode 24 can be guaranteed (i.e., equivalent to that of Comparative Example or even higher), thereby realizing an interconnection resistance which is equivalent to or higher than that of Comparative Example.

Thus, the active matrix substrate 100A of the present embodiment improves the definition up to which manufacture is possible, while securing a performance and an interconnection resistance equivalent to those of the active matrix substrate 1000 according to Comparative Example. Moreover, when compared at the same pixel pitch (i.e., the same definition), the intralayer spaces S are increased in the active matrix substrate 100A of the present embodiment, so that leak defects within the same layer can be reduced, and the production yield can be improved.

Furthermore, in the active matrix substrate 100A of the present embodiment, the upper layer electrodes 19 and the lower layer electrode 17 composing storage capacitors are each made of a transparent electrically conductive material, so that sufficient storage capacitances can be secured without allowing the aperture ratio to decrease. Moreover, since the lower layer electrode 17 permits the upper layer electrodes 19 functioning as pixel electrodes to be electrically shielded from the scanning lines 11 and the signal lines 12, capacitance (parasitic capacitance) is prevented from being generated between the upper layer electrodes 19 and the scanning lines 11 or the signal lines 12. This decreases the load on the scanning lines 11 and the signal lines 12, and enables reduced power consumption.

Next, with reference to FIG. 5 to FIG. 8, an exemplary method of producing the active matrix substrate 100A of the present embodiment will be described. FIG. 5 to FIG. 8 are step-by-step cross-sectional views for describing the method of producing the active matrix substrate 100A. (a1) to (a3) of FIG. 5 and FIGS. 6 and (a1) and (a2) of FIG. 7 and FIG. 8 correspond to a cross section taken along line 2A-2A' in FIG. 1 (i.e., a cross section containing the first contact hole 31), whereas (b1) to (b3) of FIG. 5 and FIGS. 6 and (b1) and (b2) of FIG. 7 and FIG. 8 correspond to a cross section taken along line 5B-5B' in FIG. 1 (i.e., a cross section containing the TFT 20).

First, as shown in FIGS. 5(a1) and (b1), a basecoat layer 13 is formed on a substrate 10. For example, a glass substrate is used as the substrate 10, and, as the basecoat layer 13, a multilayer film ($SiO_2$/SiON film) of an SiON film (lower layer) with a thickness of 50 nm to 100 nm and an $SiO_2$ film (upper layer) with a thickness of 50 nm to 200 nm is formed by CVD technique on the surface of this glass substrate.

Next, as shown in FIGS. 5(a2) and (b2), a semiconductor layer 21 is formed on the basecoat layer 13. For example, by a known technique, a polycrystalline silicon (poly-Si) layer is formed in island shapes as the semiconductor layer 21, with a thickness of 30 nm to 60 nm.

Then, as shown in FIGS. 5(a3) and (b3), a gate insulating layer 14 covering the semiconductor layer 21 is formed. For example, by CVD technique, an $SiO_2$ film with a thickness of 50 nm to 100 nm is formed as the gate insulating layer 14.

Thereafter, as shown in FIGS. 6(a1) and (b1), scanning lines 11 and gate electrodes 22 are formed on the gate insulating layer 14. For example, by sputtering technique, a multilayer film of a TaN film (lower layer) with a thickness of 30 nm to 50 nm and a W film (upper layer) with a thickness of 300 nm to 400 nm is deposited, and this multilayer film (W/TaN film) is patterned by photolithography technique to form the scanning lines 11 and the gate electrodes 22.

Next, as shown in FIGS. 6(a2) and (b2), a second interlayer insulating layer 15 covering the scanning lines 11 and the gate electrodes 22 is formed. For example, by CVD technique, a multilayer film ($SiO_2$/SiNx film) of a SiNx film (lower layer) with a thickness of 100 nm to 300 nm and an $SiO_2$ film (upper layer) with a thickness of 400 nm to 700 nm is formed as the second interlayer insulating layer 15. Thereafter, via etching, contact holes 32 and 33 (not shown in FIGS. 6(a2) and (b2)) through which to expose portions of the semiconductor layer 21 are formed in the gate insulating layer 14 and in the second interlayer insulating layer 15.

Then, as shown in FIGS. 6(a3) and (b3), signal lines 12, source electrodes 23 (not shown in FIGS. 6(a3) and (b3)) and drain electrodes 24 are formed on the second interlayer insulating layer 15. For example, by sputtering technique, a multilayer film of a Ti film (lower layer) with a thickness of 30 nm to 50 nm, an Al layer (intermediate layer) with a thickness of 300 nm to 500 nm, and a Ti film (upper layer) with a thickness of 30 nm to 50 nm is deposited, and this multilayer film (Ti/Al/Ti film) is patterned by photolithography technique to form the signal lines 12, the source electrodes 23, and the drain electrodes 24. In this manner, the TFTs 20 can be formed on the substrate 10.

Next, as shown in FIGS. 7(a1) and (b1), a first interlayer insulating layer 16 covering the TFT 20 and having first apertures 16a is formed. Preferably, the first interlayer insulating layer 16 includes a layer of an organic material such as a resin. For example, the first interlayer insulating layer 16 having the first apertures 16a may be formed by using a positive-type photosensitive resin film with a thickness of 2 μm to 3 μm as the first interlayer insulating layer 16.

Then, as shown in FIGS. 7(a2) and (b2), a lower layer electrode (functioning as a storage capacitor line and a storage capacitor electrode) 17 is formed on the first interlayer insulating layer 16. For example, by sputtering technique, an ITO film with a thickness of 50 nm to 200 nm is formed as the lower layer electrode 17. Note that the electrically conductive film of the lower layer electrode 17 is removed near the regions to later become first contact holes 31 (i.e., near the first apertures 16a).

Next, as shown in FIGS. 8(a1) and (b1), a dielectric layer 18 having second apertures 18a is formed on the lower layer electrode 17. For example, by CVD technique, an SiNx film with a thickness of 100 nm to 300 nm is deposited, and second apertures 18a are formed in this SiNx film via etching, thus forming the dielectric layer 18.

Thereafter, as shown in FIGS. 8(a2) and (b2), on the dielectric layer 18, upper layer electrodes (functioning as pixel electrodes) 19 are formed which overlap at least portions of the lower layer electrode 17 via the dielectric layer 18. For example, an ITO film with a thickness of 50 nm to 200 nm is deposited by sputtering technique, and this ITO film is patterned by photolithography technique to form the upper layer electrodes 19. Each upper layer electrode 19 is electrically connected to a drain electrode 24 in a first contact hole 31, which includes the first aperture 16a in the first interlayer insulating layer 16 and the second aperture 18a in the dielectric layer 18.

The step of forming the first interlayer insulating layer 16 and the step of forming the dielectric layer 18 are conducted in such a manner that the width $W1_H$ of the first aperture 16a along the horizontal direction (first direction) is smaller than the width $W2_H$ of the second aperture 18a along the horizontal direction. Moreover, these two steps are conducted in such a manner that, when viewed from the normal direction of the substrate 10, a portion of the contour of the second aperture 18a is located inside the contour of the first aperture 16a.

In this manner, the active matrix substrate 100A of the present embodiment can be produced.

Although the present embodiment illustrates an exemplary case where the width $W1_H$ of the first aperture 16a along the horizontal direction (first direction) is smaller than the width $W2_H$ of the second aperture 18a along the horizontal direction, the present invention is not limited thereto. In the case where the drain electrodes 24 are made of the same electrically conductive film as the signal lines 12, which is the case with the present embodiment, it is preferable that the width $W1_H$ of the first aperture 16a along the horizontal direction is smaller than the width $W2_H$ of the second aperture 18a along the horizontal direction, in order to ensure sufficient intralayer spaces along the horizontal direction. In the case of ensuring sufficient intralayer spaces along the vertical direction, the width of the first aperture 16a along the vertical direction (second direction) is made smaller than the width of the second aperture 18a along the vertical direction. In other words, a construction in which the first aperture 16a and the second aperture 18a shown in FIG. 1 are rotated by 90° may be adopted.

Moreover, although the present embodiment illustrates a pixel structure for a liquid crystal display device of the VA mode, the present invention can be suitably used as a pixel structure for liquid crystal display devices of other display modes, e.g., a pixel structure for a liquid crystal display device of the FFS mode. A liquid crystal display device of the VA mode includes a vertical-alignment type liquid crystal layer, whereas a liquid crystal display device of the FFS mode includes a horizontal-alignment type liquid crystal layer. Moreover, there are no constraints as to the position of the drain electrode 24 within a pixel. Without being limited to near the center of the pixel as is illustrated in FIG. 1 and the like, any optimum position as adapted to the pixel structure (electrode structure) for each given display mode may be used.

Embodiment 2

Figure 9:
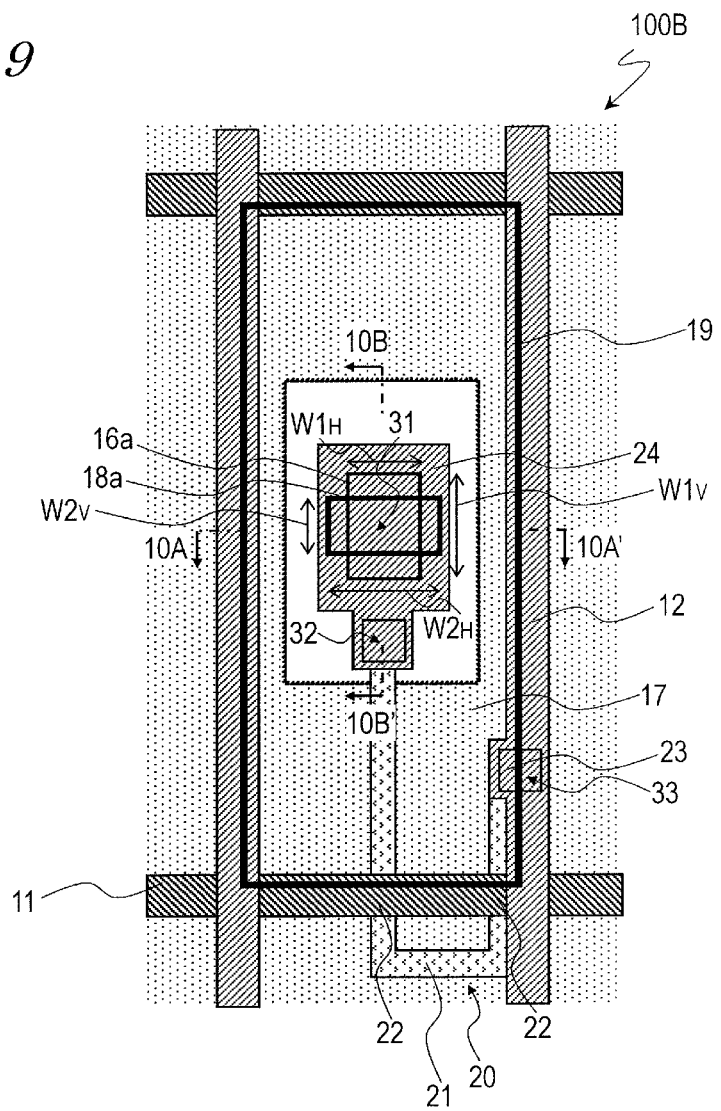
FIG. 9 A diagram schematically showing an active matrix substrate 100B according to a preferred embodiment of the present invention, as a plan view showing a region corresponding to one pixel.

FIG. 9 and FIG. 10 show an active matrix substrate 100B according to the present embodiment. FIG. 9 is a plan view schematically showing the active matrix substrate 100B, and FIGS. 10(a) and (b) are cross-sectional views taken along line 10A-10A' and line 10B-10B' in FIG. 9, respectively. Hereinafter, differences of the active matrix substrate 100B from the active matrix substrate 100A of Embodiment 1 will be mainly described.

In the active matrix substrate 100B, similarly to the active matrix substrate 100A of Embodiment 1, the width $W1_H$ of the first aperture 16a along the horizontal direction (first direction) is smaller than the width $W2_H$ of the second aperture 18a along the horizontal direction. In other words, among the four sides constituting the contour of the first aperture 16a, the two sides which are substantially parallel to the horizontal direction are shorter than the two sides among the four sides constituting the contour of the second aperture 18a which are substantially parallel to the horizontal direction.

Furthermore, in the active matrix substrate 100B, the width $W1_V$ of the first aperture 16a along the vertical direction (second direction) is greater than the width $W2_V$ of the second aperture 18a along the vertical direction. In other words, among the four sides constituting the contour of the first aperture 16a, the two sides which are substantially parallel to the vertical direction are longer than the two sides among the four sides constituting the contour of the second aperture 18a which are substantially parallel to the vertical direction.

Therefore, in the active matrix substrate 100B, among the contour of the second aperture 18a, both of the two sides which are substantially parallel to the horizontal direction (the upper side and the lower side) are located partially inside the contour of the first aperture 16a when viewed from the normal direction of the substrate 10.

In the active matrix substrate 100B of the present embodiment, too, the width $W1_H$ of the first aperture 16a along the horizontal direction (first direction) is smaller than the width $W2_H$ of the second aperture 18a along the horizontal direction. Therefore, while securing the same light-shielding width SW as conventionally (i.e., without a decrease in the contrast ratio caused by disorderly alignment), the width $W3_H$ of the drain electrode 24 along the horizontal direction can be reduced. This makes it possible to secure sufficient intralayer spaces S, such that the definition up to which manufacture is possible can be increased.

In the present embodiment, too, portions of the contour of the second aperture 18a are located inside the contour of the first aperture 16a. Furthermore, in the present embodiment, among the contour of the second aperture 18a, both of the two sides which are substantially parallel to the horizontal direction are located partially inside the contour of the first aperture 16a when viewed from the normal direction of the substrate 10. As a result, in a cross section where the contour of the second aperture 18a is located inside the contour of the first aperture 16a (i.e., a cross section shown in FIG. 10(b)), stepping of the upper layer electrodes 19 is further suppressed. In FIG. 10(b), it must be noted that the right and left side face shapes of the first contact hole 31 are identical to those in the active matrix substrate 1000 according to Comparative Example. Therefore, beginning from these portions (portions of the upper side and the lower side along the contour of the second aperture 18a), the area of contact between each upper layer electrode 19 and each drain electrode 24 can be made even larger than that in the active matrix substrate 100A of Embodiment 1, whereby the interconnection resistance can be further reduced.

Moreover, in the active matrix substrate 1000 according to Comparative Example, the area of contact between each upper layer electrode 19 and each drain electrode 24 depends on the finished diameter of the second aperture 18a in the dielectric layer 18. Now, the area of contact also includes the geometric area of portions corresponding to the corners of the rectangle. This induces a problem in that, unless a miniaturization technique such as OPC (Optical Proximity Correction) is applied, the corner portions will be rounded to result in a smaller area of contact, thus causing greater fluctuation in the finish.

The active matrix substrate 100B of the present embodiment has a structure in which no rectangular corners are included in the area of contact between each upper layer electrode 19 and each drain electrode 24, so that the interconnection resistance can be reduced without applying any miniaturization technique such as OPC, and that fluctuation in the finish can also be reduced.

Embodiment 3

Figure 11:
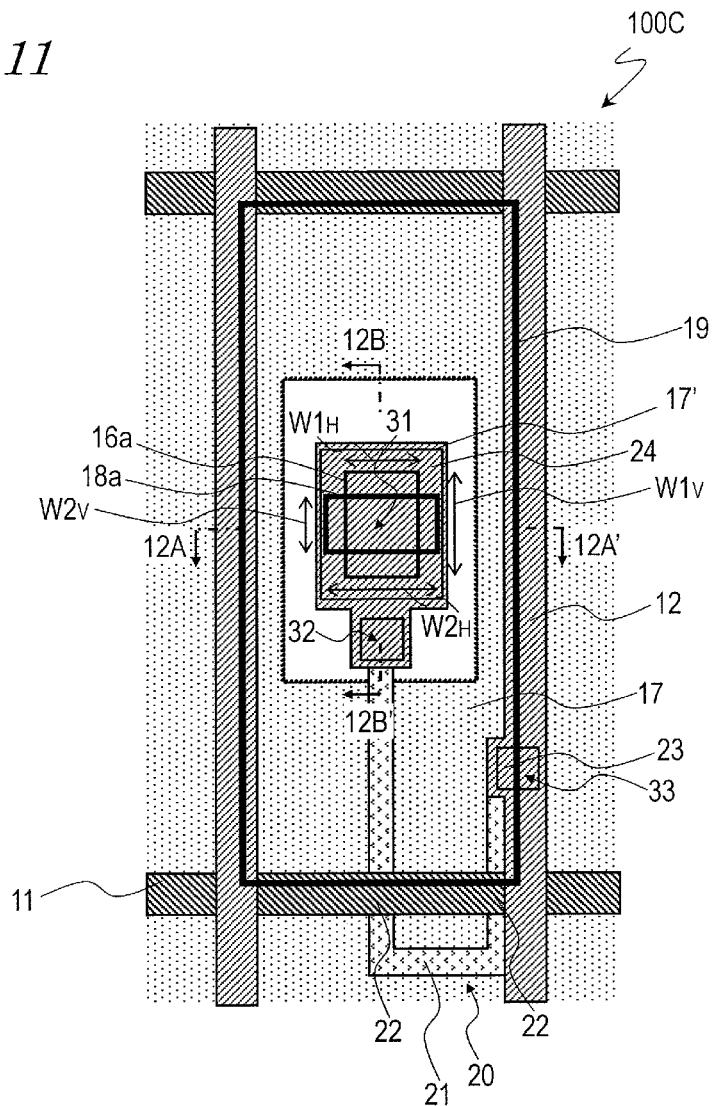
FIG. 11 A diagram schematically showing an active matrix substrate 100C according to a preferred embodiment of the present invention, as a plan view showing a region corresponding to one pixel.

FIG. 11 and FIG. 12 show an active matrix substrate 100C according to the present embodiment. FIG. 11 is a plan view schematically showing the active matrix substrate 100C, and FIGS. 12(a) and (b) are cross-sectional views taken along line 12A-12A' and line 12B-12B' in FIG. 11, respectively. Hereinafter, differences of the active matrix substrate 100C from the active matrix substrate 100B of Embodiment 2 will be mainly described.

As shown in FIG. 11 and FIGS. 12(a) and (b), the active matrix substrate 100C further includes connection electrodes 17' for electrically connecting the upper layer electrodes 19 to the drain electrodes 24. The connection electrodes 17' are made of the same electrically conductive film as the lower layer electrode 17. In other words, in the step of forming the lower layer electrode 17, the connection electrode 17' is concurrently formed by using the same electrically conductive material as that of the lower layer electrode 17 (which herein is a transparent electrically conductive material).

In the first contact hole 31, the connection electrode 17' is in contact with the drain electrode 24, and also the upper layer electrode 19 is in contact with the connection electrode 17', whereby the upper layer electrode 19 is electrically connected to the drain electrode 24.

In the active matrix substrate 100C of the present embodiment, the aforementioned connection electrodes 17' are provided, so that, when forming the second apertures 18a in the dielectric layer 18 via etching, the tapered portions of the first apertures 16a are covered by the connection electrodes 17'. As a result, the tapered portions of the first aperture 16a are prevented from being eroded and becoming steep. Therefore, in a cross section where the width of the first aperture 16a is smaller than the width of the second aperture 18a (a cross section shown in FIG. 12(a) where $W1_H < W2_H$), stepping of the upper layer electrodes 19 can be suppressed. Moreover, since the connection electrodes 17' and the upper layer electrodes 19 are stacked, redundant structure is also realized, thereby providing an effect of reliability improvement.

Embodiment 4

Figure 13:
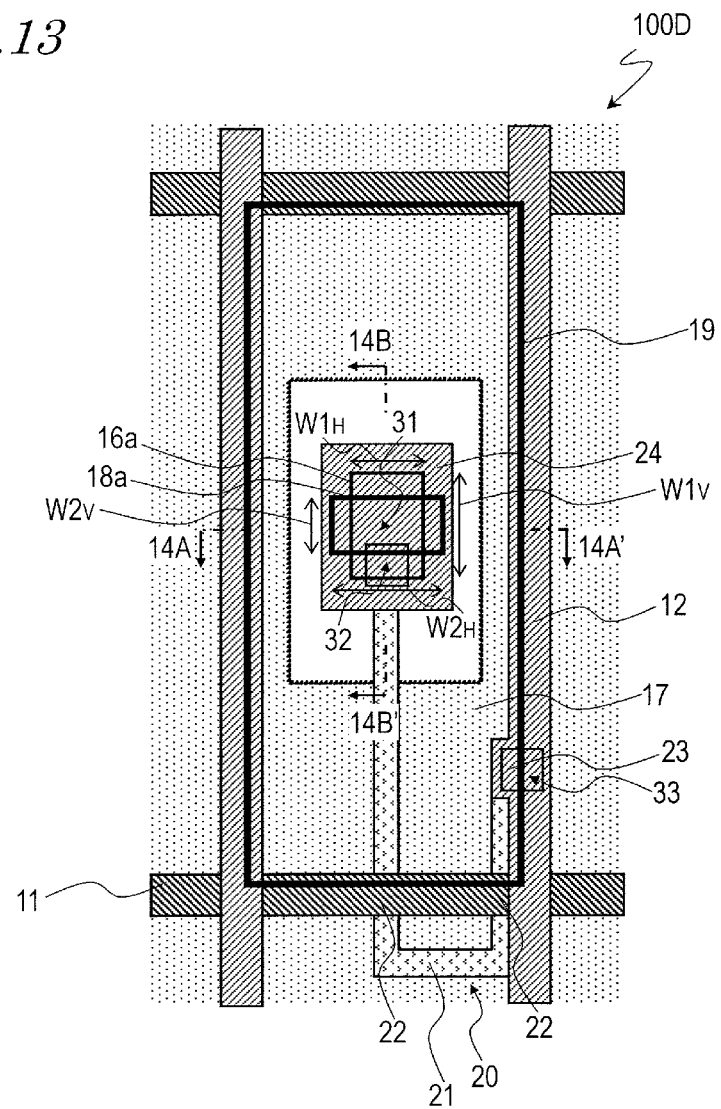
FIG. 13 A diagram schematically showing an active matrix substrate 100D according to a preferred embodiment of the present invention, as a plan view showing a region corresponding to one pixel.

FIG. 13 and FIG. 14 show an active matrix substrate 100D according to the present embodiment. FIG. 13 is a plan view schematically showing the active matrix substrate 100D, and FIGS. 14(a) and (b) are cross-sectional views taken along line 14A-14A' and line 14B-14B' in FIG. 13, respectively. Hereinafter, differences of the active matrix substrate 100D from the active matrix substrate 100B of Embodiment 2 will be mainly described.

The active matrix substrate 100D of the present embodiment differs from the active matrix substrate 100B of Embodiment 2 in terms of positioning of the second contact holes 32 formed in the gate insulating layer 14 and the second interlayer insulating layer 15.

In the active matrix substrate 100B of Embodiment 2, as shown in FIG. 9 and FIG. 10(b), the second contact hole 32 does not overlap the first contact hole 31 when viewed from the normal direction of the substrate 10.

On the other hand, in the active matrix substrate 100D of the present embodiment, as shown in FIG. 13 and FIG. 14(b), at least a portion of the second contact hole 32 overlaps the first contact hole 31 when viewed from the normal direction of the substrate 10. Moreover, when viewed from the normal direction of the substrate 10, the center of the first contact hole 31 and the center of the second contact hole 32 are deviated.

In the active matrix substrate 100D of the present embodiment, as described above, at least a portion of the second contact hole 32 overlaps the first contact hole 31, so that the size of the drain electrode 24 can be further reduced. Therefore, the aperture ratio can be further improved.

Note that, when adopting a construction in which at least a portion of the second contact hole 32 overlaps the first contact hole 31 as in the present embodiment, it is preferable that the center of the first contact hole 31 and the center of the second contact hole 32 are deviated, as illustrated in FIG. 13 and FIG. 14(b). The reason is that, if the center of the first contact hole 31 coincides with the center of the second contact hole 32, the film thickness to be etched when forming the second apertures 18a in the dielectric layer 18 will extremely increase, thus leading to a possibility that the dielectric layer 18 cannot be apertured.

Although Embodiments 1 to 4 above illustrate TFTs 20 of the top gate type, the present invention is not limited thereto. Bottom-gate type TFTs may be used as the TFTs 20. In that case, the gate insulating layer 14 is provided so as to cover the gate electrodes 22. Moreover, the second interlayer insulating layer 15 is provided so as to cover the semiconductor layer 21. Furthermore, the second contact holes 32 are not formed in the gate insulating layer 14, but are only formed in the second interlayer insulating layer 15.

(Liquid Crystal Display Device Construction)

Now, a specific construction for a liquid crystal display device in which the active matrix substrates 100A to 100D of Embodiments 1 to 4 may be used will be described.

Figure 15:
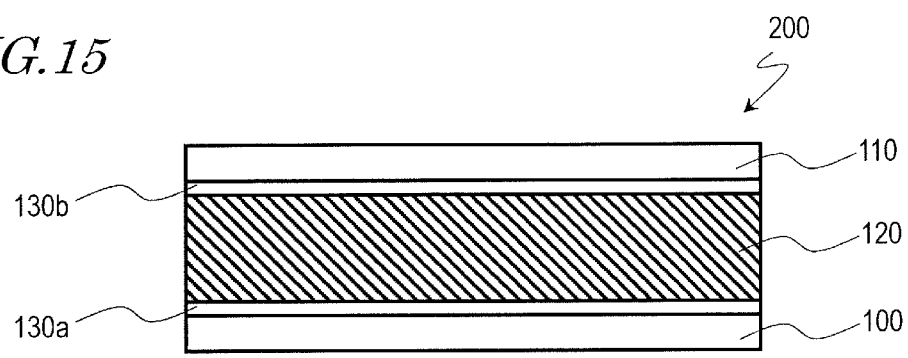
FIG. 15 A cross-sectional view schematically showing a liquid crystal display device 200 in which the active matrix substrates 100A to 100D according to preferred embodiments of the present invention may be used.

A liquid crystal display device 200 shown in FIG. 15 includes an active matrix substrate 100, a counter substrate 110, and a liquid crystal layer 120.

The active matrix substrate 100 is, for example, one of the active matrix substrates 100A to 100D of Embodiments 1 to 4.

The counter substrate 110 is provided opposite from the active matrix substrate 100. Typically, color filters (not shown) are provided on the counter substrate 110. Moreover, in display modes (e.g., the VA mode) where a vertical electric field is applied across the liquid crystal layer 120, a counter electrode (common electrode; not shown) opposing the pixel electrodes (the upper layer electrodes 19 shown in FIG. 1 and so on) is provided on the counter substrate 110. In display modes (e.g., the FFS mode) where a lateral electric field is applied across the liquid crystal layer 120, a common electrode is provided on the active matrix substrate 100. For example, the lower layer electrode in a two-layer electrode structure may be allowed to function as a common electrode.

The liquid crystal layer 120 is provided between the active matrix substrate 100 and the counter substrate 110. As the liquid crystal layer 120, a vertical-alignment type liquid crystal layer is used under the VA mode, and a horizontal-alignment type liquid crystal layer is used under the FFS mode.

On the respective surfaces of the active matrix substrate 100 and the counter substrate 110 facing the liquid crystal layer 120, alignment films 130a and 130b are provided. As the alignment films 130a and 130b, vertical alignment films or horizontal alignment films are to be used, depending on the display mode.

Typically, a pair of polarizers which oppose each other via the liquid crystal layer 120 are provided. Furthermore, as necessary, a phase plate(s) is provided on the rear face side and/or the viewer side of the liquid crystal layer 120.

Hereinafter, an example of a specific pixel structure when adopting the VA mode or the FFS mode for the liquid crystal display device 200 will be described. In the examples described below, the shapes and positioning of the first apertures 16a and the second apertures 18a in the active matrix substrate 100 are identical to those in the active matrix substrate 100B of Embodiment 2. It will be appreciated that the shapes and positioning of the first apertures 16a and the second apertures 18a may be identical to those in the active matrix substrates 100A, 100C, and 100D of Embodiments 1, 3, and 4.

Figure 16:
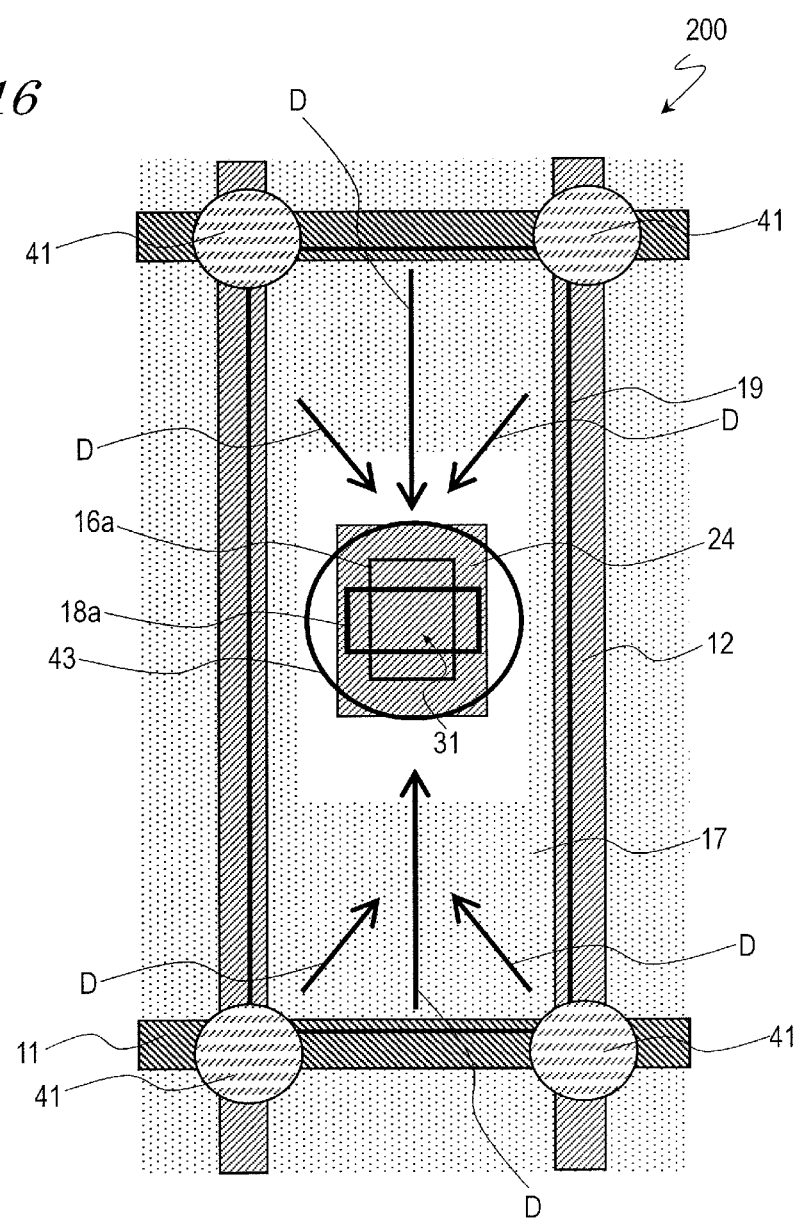
FIG. 16 A diagram showing an example pixel structure when adopting the VA mode for the liquid crystal display device 200, as a plan view showing a region corresponding to one pixel.

FIG. 16 shows an example pixel structure under the VA mode. In the example shown in FIG. 16, the upper layer electrodes 19 functioning as pixel electrodes are so-called spread electrodes. A plurality of columnar spacers 41 are formed on the active matrix substrate 100. Each columnar spacer 41 is disposed at an intersection between a scanning line 11 and a signal line 12. In other words, four columnar spacers 41 are disposed at the four corners of each pixel in total. In the counter electrode on the counter substrate 110, an aperture 43 is formed in a region corresponding to the center of each pixel.

Each columnar spacer 41 provides an alignment regulating force which aligns the liquid crystal molecules perpendicularly to the side face thereof. Moreover, each aperture 43 in the counter electrode exhibits an alignment regulating force which, under an applied voltage, inclines the liquid crystal molecules in a direction that is orthogonal to the edge thereof. Therefore, when a voltage is applied across the liquid crystal layer 120, a liquid crystal domain that takes an axisymmetric alignment (radially-inclined alignment) is created in each pixel. FIG. 16 shows the alignment directions of liquid crystal molecules under an applied voltage with arrows D. In one liquid crystal domain, the liquid crystal molecules are aligned in essentially all azimuth directions, whereby good viewing angle characteristics are obtained.

Figure 17:
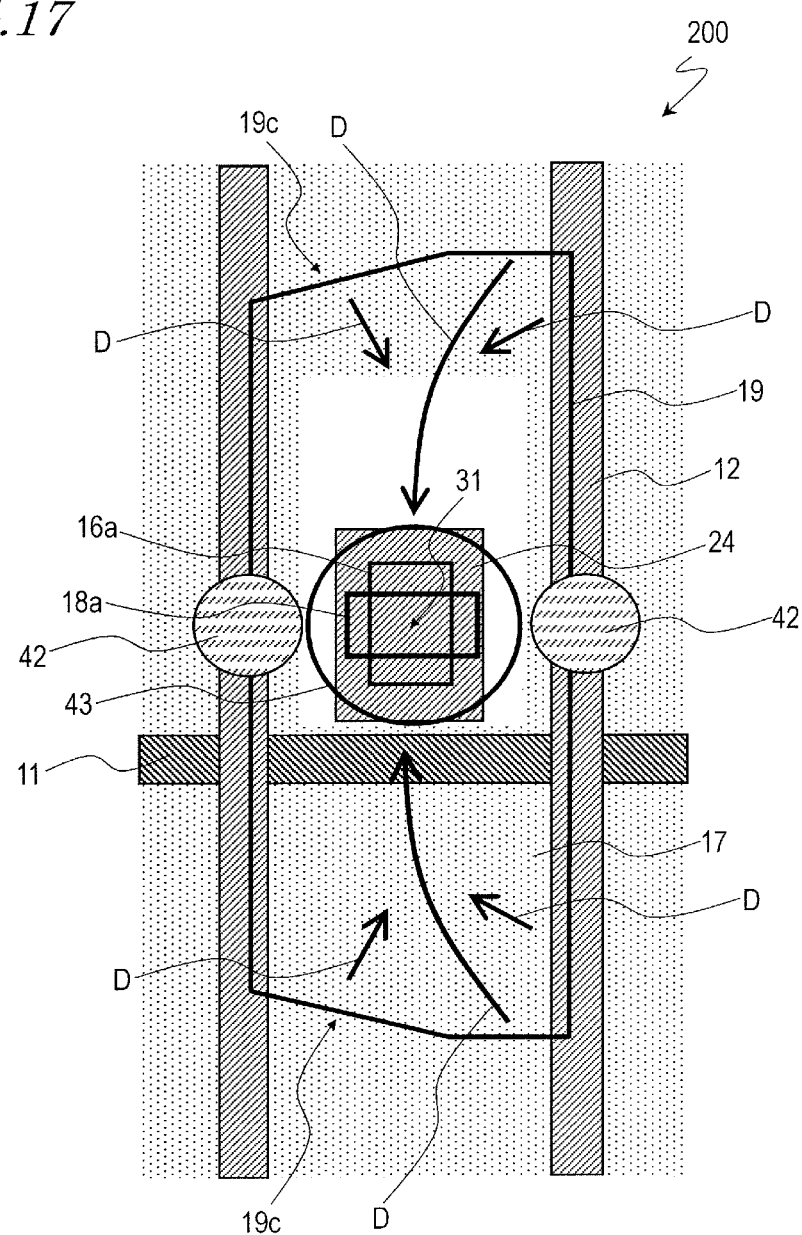
FIG. 17 A diagram showing another example pixel structure when adopting the VA mode for the liquid crystal display device 200, as a plan view showing a region corresponding to one pixel.

FIG. 17 shows another example pixel structure in the case where the VA mode is adopted. In the example shown in FIG. 17, too, in the counter electrode on the counter substrate 110, an aperture 43 is formed in a region corresponding to the center of each pixel. However, in the example shown in FIG. 17, a plurality of columnar spacers 42 are formed not on the active matrix substrate 100 but on the counter substrate 110. Moreover, each columnar spacer 42 is disposed so as to overlap a signal line 12, and, along the vertical direction, located near the center of each pixel.

In the example shown in FIG. 17, too, when a voltage is applied across the liquid crystal layer 120, the alignment regulating force of the columnar spacers 42 and the alignment regulating force of the apertures 43 in the counter electrode cause a liquid crystal domain having an axisymmetric alignment to be created in each pixel. The direction of the alignment regulating force exerted on the liquid crystal molecules is different between the columnar spacers 41 formed on the active matrix substrate 100 and the columnar spacers 42 formed on the counter substrate 110; therefore, in order to reflect this difference, different planar positioning schemes are adopted for the columnar spacers 41 formed on the active matrix substrate 100 and the columnar spacers 42 formed on the counter substrate 110.

In the example shown in FIG. 17, bevels 19c are formed in the upper left corner and lower left corner of the upper layer electrode 19 functioning as a pixel electrode. This is in order to improve display quality by restricting the positions of centers of alignment that form in between pixels. Under an applied voltage across the liquid crystal layer 120, centers of alignment are created not only at the center of each aperture 43 in the counter electrode (pixel center), but also between any two pixels adjoining along the up-down direction (the vertical direction on the display surface). The alignment regulating force that creates such a center of alignment between pixels may be weakened under the influence of various conditions such as the cell thickness, how the electrode pattern of pixel electrodes is finished, the pretilt angle (in the case where a PSA technique as disclosed in Japanese Laid-Open Patent Publication No. 2002-357830 is applied), and so on. Therefore, the positions of the centers of alignment along the right-left direction may fluctuate from pixel to pixel. These fluctuations may cause deteriorations in display quality, such as displaying coarseness and abnormal coloration when the viewing angle is inclined along the right-left direction. By forming the bevels 19c in the upper layer electrodes 19, it becomes possible to restrict the positions of the centers of alignment between upper and lower pixels. Specifically, when the bevels 19c are formed at the left-hand side (the upper left corner and lower left corner) of the upper layer electrodes 19 as described above, the centers of alignment can be stabilized at the side where the interval between pixel electrodes (i.e., between upper layer electrodes 19) is narrower (i.e., at the right-hand side where the bevels 19c are not formed).

Although the example shown in FIG. 17 illustrates that the scanning line 11 is disposed across the neighborhood of the center of the pixel, the position of the scanning line is not limited thereto. However, in the case where columnar spacers 42 are formed on the counter substrate 110, in order to prevent leakage of light near the columnar spacers 42, it is preferable to provide a stripe-shaped black matrix (light shielding layer) that extends along the horizontal direction on the counter substrate 110, in order to shade a region of 3 μm to 5 μm around each columnar spacer 42. Therefore, as shown in FIG. 17, the scanning line may be disposed across the neighborhood of the pixel center so as to overlap the black matrix on the counter substrate 110, thereby realizing a high aperture ratio.

Figure 18:
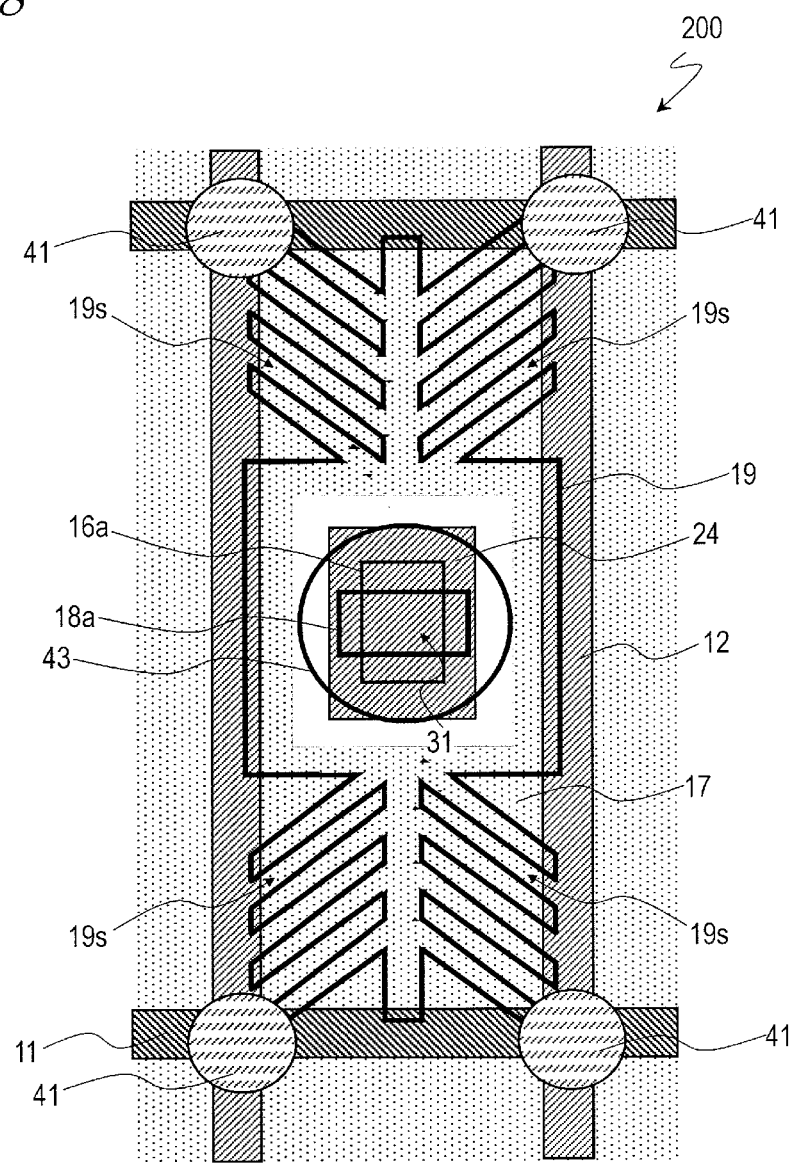
FIG. 18 A diagram showing still another example pixel structure when adopting the VA mode for the liquid crystal display device 200, as a plan view showing a region corresponding to one pixel.
Figure 19:
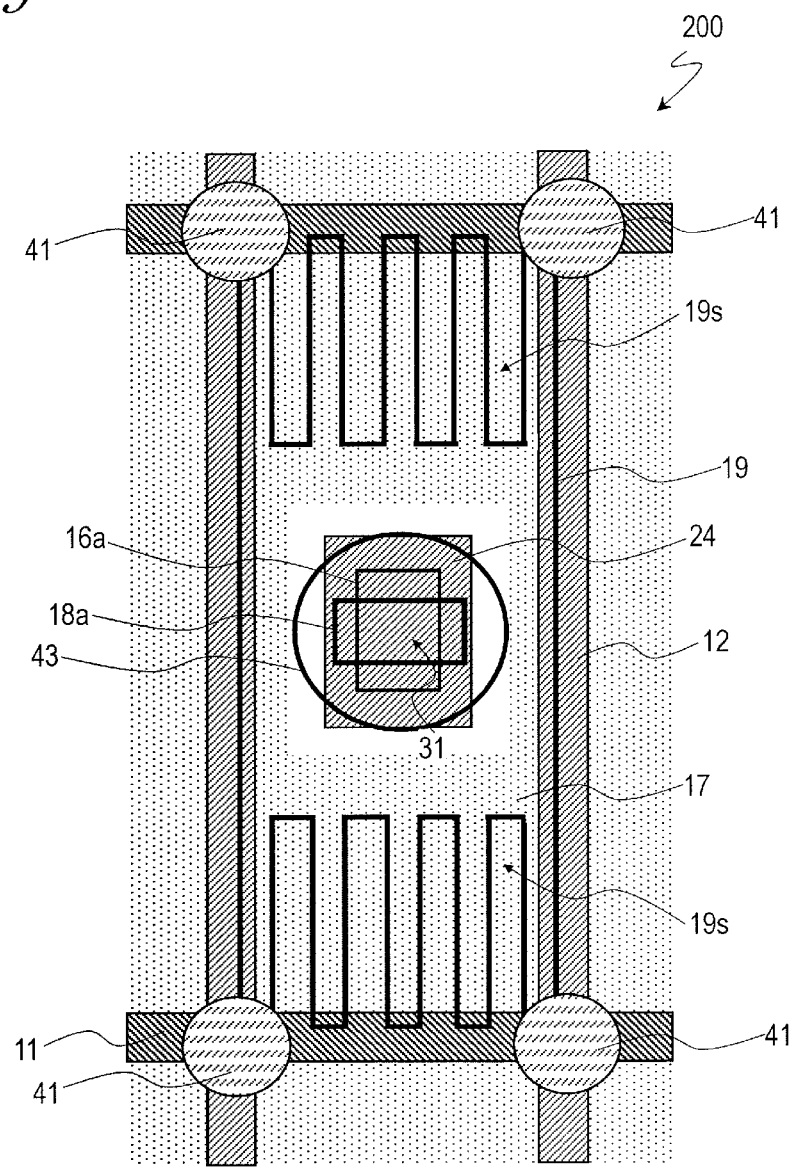
FIG. 19 A diagram showing still another example pixel structure when adopting the VA mode for the liquid crystal display device 200, as a plan view showing a region corresponding to one pixel.

FIG. 18 and FIG. 19 show still another example pixel structure under the VA mode. In the examples shown in FIG. 18 and FIG. 19, a plurality of columnar spacers 41 are formed on the active matrix substrate 100. Each columnar spacer 41 is disposed at an intersection between a scanning line 11 and a signal line 12. In other words, four columnar spacers 41 are disposed at the four corners of each pixel in total. In the counter electrode on the counter substrate 110, an aperture 43 is formed in a region corresponding to the center of each pixel.

Furthermore, in the example shown in FIG. 18 and FIG. 19, the upper layer electrodes 19 functioning as pixel electrodes have a plurality of slits 19s. In the example shown in FIG. 18, the plurality of slits 19s extend substantially parallel to a direction which is at an angle of 45° with respect to the horizontal direction and the vertical direction. In the example shown in FIG. 19, the plurality of slits 19s extend substantially parallel to the vertical direction. Under an applied voltage, the slits 19s exhibit an alignment regulating force which inclines the liquid crystal molecules substantially parallel to the direction in which the slits 19s extend.

In the examples shown in FIG. 18 and FIG. 19, when a voltage is applied across the liquid crystal layer 120, alignment regulation is achieved by the alignment regulating force of the columnar spacers 41, the alignment regulating force of the apertures 43 in the counter electrode, and the alignment regulating force of the plurality of slits 19s in the upper layer electrodes (pixel electrodes) 19. In the examples shown in FIG. 18 and FIG. 19, due to the addition of the alignment regulating force of the plurality of slits 19s in the upper layer electrodes 19, the alignment state can be more stable and the response speed more improved than in the example shown in FIG. 16. Moreover, in the examples shown in FIG. 18 and FIG. 19, the effective applied voltage across the liquid crystal layer 120 differs between the regions of the upper layer electrodes 19 where the slits 19s are formed (i.e., the portion located above the pixel and the portion located below) and the region where the slits 19s are not formed (i.e., the portion located in the center of the pixel). Therefore, different, plural sets of γ characteristics (gray scale dependences of display luminance) are allowed to be mixedly present in one pixel, and displaying can be performed via their composition, whereby the viewing angle dependence of γ characteristics can be reduced. A viewing angle dependence of γ characteristics is a problematic difference between the γ characteristics when observed from the frontal direction and the γ characteristics when observed from an oblique direction, which is visually perceived as a color change when an intermediate gray scale tone is observed from an oblique direction (called "whitening" or "color shifting").

Figure 20:
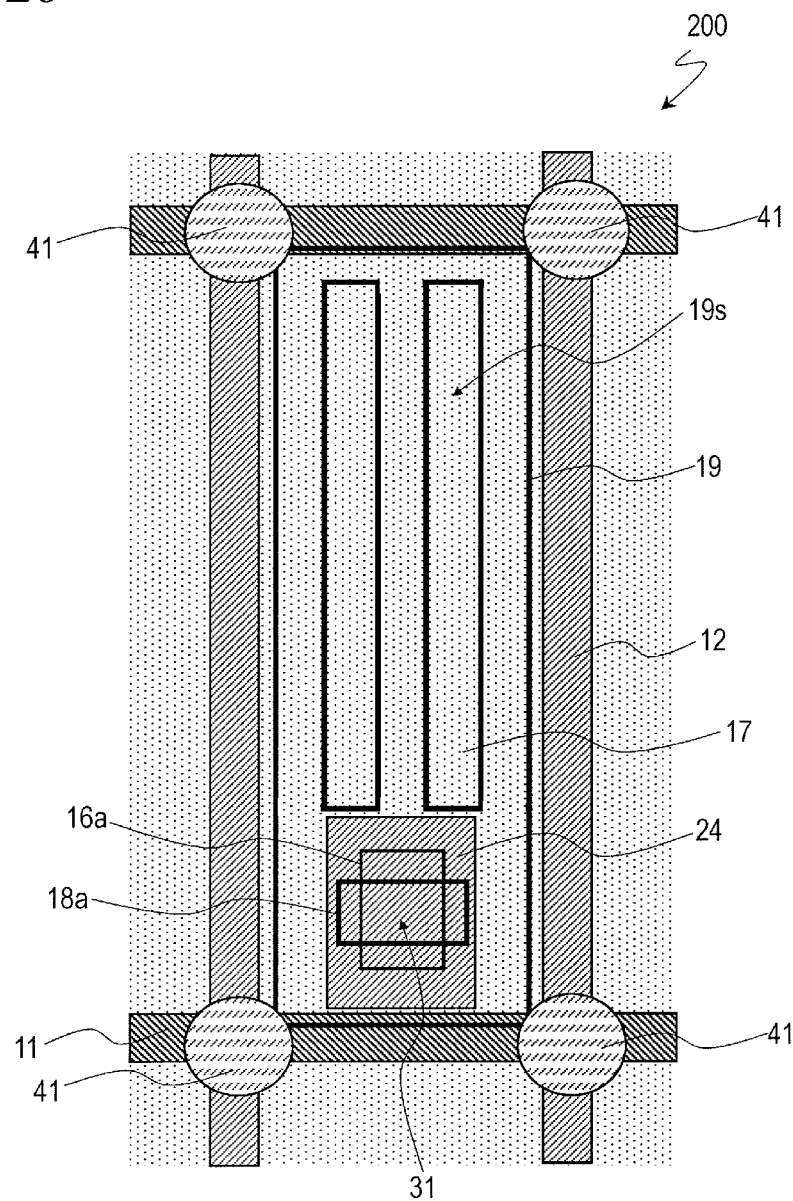
FIG. 20 A diagram showing an example pixel structure when adopting the FFS mode for the liquid crystal display device 200, as a plan view showing a region corresponding to one pixel.
Figure 21:
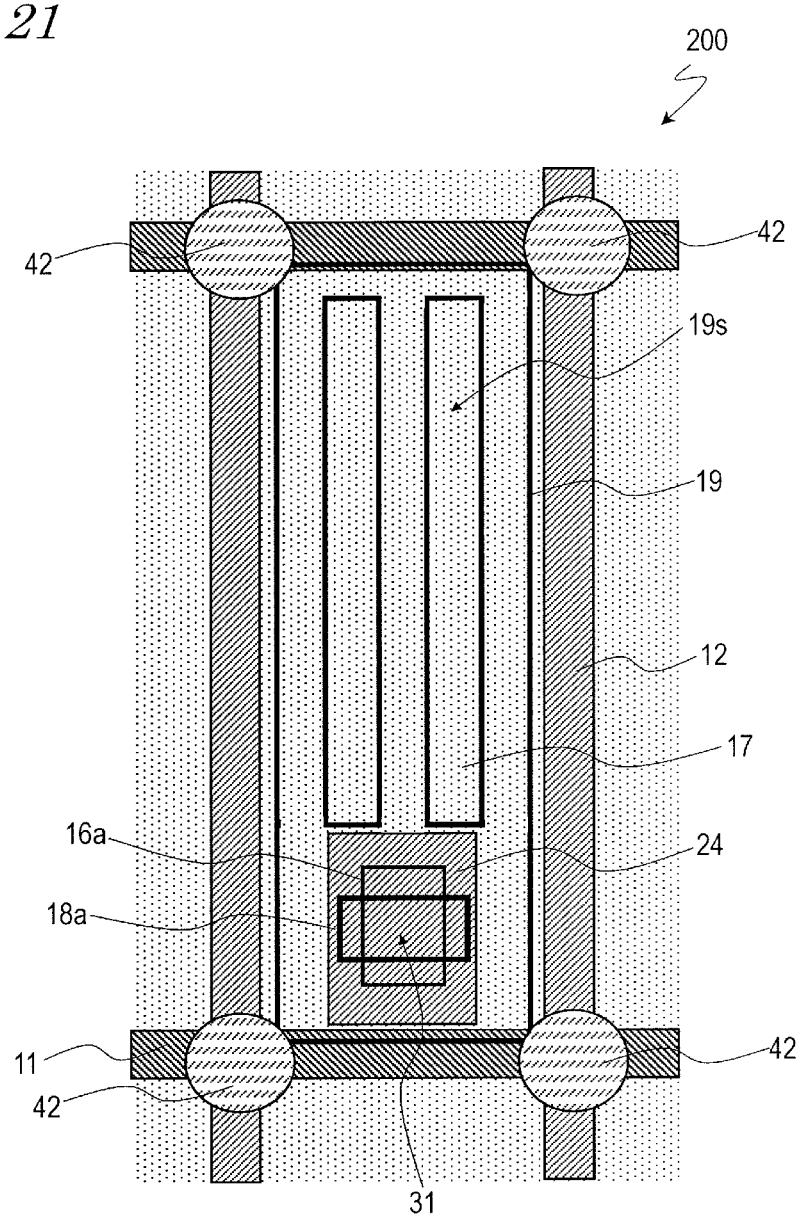
FIG. 21 A diagram showing another example pixel structure when adopting the FFS mode for the liquid crystal display device 200, as a plan view showing a region corresponding to one pixel.

FIG. 20 and FIG. 21 show example pixel structures under the FFS mode. In the examples shown in FIG. 20 and FIG. 21, the upper layer electrodes 19 functioning as pixel electrodes have a plurality of slits 19s. The plurality of slits 19s extend substantially parallel to the vertical direction. Moreover, the lower layer electrode 17 functions as a common electrode.

In the examples shown in FIG. 20 and FIG. 21, when a potential difference is given between the upper layer electrode 19 and the lower layer electrode 17, a lateral electric field (oblique electric field) is generated, such that the lateral electric field controls the alignment state of liquid crystal molecules. In a display mode where a lateral electric field is applied across the liquid crystal layer 120, the alignment direction of the liquid crystal molecules varies within the display surface (i.e., the layer plane of the liquid crystal layer 120), whereby good viewing angle characteristics are obtained.

In the example shown in FIG. 20, a plurality of columnar spacers 41 are formed on the active matrix substrate 100. In the example shown in FIG. 21, a plurality of columnar spacers 42 are formed on the counter substrate 110.

INDUSTRIAL APPLICABILITY

According to an embodiment of the present invention, there is provided an active matrix substrate which can be produced with a higher definition than conventionally, in spite of having a two-layer electrode structure. The present invention is broadly applicable to active matrix substrates for liquid crystal display devices of various display modes.

REFERENCE SIGNS LIST 10 substrate
11 scanning line
12 signal line
13 basecoat layer
14 gate insulating layer
15 second interlayer insulating layer
16 first interlayer insulating layer
16a first aperture (aperture in first interlayer insulating layer)
17 lower layer electrode
18 dielectric layer
18a second aperture (aperture in dielectric layer)
19 upper layer electrode (pixel electrode)
19s slit
20 thin film transistor (TFT)
21 semiconductor layer
22 gate electrode
23 source electrode
24 drain electrode
31 first contact hole
32 second contact hole
33 third contact hole
41, 42 columnar spacers
43 aperture in counter electrode
100, 100A, 100B, 100C, 100D active matrix substrate

The invention claimed is:

1. An active matrix substrate comprising:
a substrate;
a thin film transistor being supported by the substrate and including a semiconductor layer, a gate electrode, a source electrode, and a drain electrode;
a scanning line provided so as to extend substantially parallel to a first direction, and electrically connected to the gate electrode of the thin film transistor;
a signal line provided so as to extend substantially parallel to a second direction orthogonal to the first direction, and electrically connected to the source electrode of the thin film transistor;
a first interlayer insulating layer provided so as to cover the thin film transistor;
a lower layer electrode provided on the first interlayer insulating layer;
a dielectric layer provided on the lower layer electrode; and
an upper layer electrode being provided on the dielectric layer and overlapping at least a portion of the lower layer electrode via the dielectric layer, wherein,
a first contact hole through which a portion of the drain electrode is exposed is formed in the first interlayer insulating layer and the dielectric layer, the first contact hole allowing the upper layer electrode to be electrically connected to the drain electrode;
the first contact hole includes a first aperture formed in the first interlayer insulating layer and a second aperture formed in the dielectric layer;
a width of the first aperture along one of the first direction and the second direction is smaller than a width of the second aperture along the one direction; and
when viewed from a normal direction of the substrate, a portion of the contour of the second aperture is located inside the contour of the first aperture.

2. The active matrix substrate of claim 1, wherein, when viewed from the normal direction of the substrate, the first aperture and the second aperture each have a rectangular contour.

3. The active matrix substrate of claim 2, wherein, when viewed from the normal direction of the substrate, the contour of the second aperture includes two sides which are substantially parallel to the one direction, one of the two sides being located partially inside the contour of the first aperture.

4. The active matrix substrate of claim 2, wherein, when viewed from the normal direction of the substrate, the contour of the second aperture includes two sides which are substantially parallel to the one direction, both of the two sides being located partially inside the contour of the first aperture.

5. The active matrix substrate of claim 1, wherein a width of the first aperture along the other of the first direction and the second direction is greater than a width of the second aperture along the other direction.

6. The active matrix substrate of claim 1, wherein, in the first contact hole, the upper layer electrode is in contact with the drain electrode.

7. The active matrix substrate of claim 1, further comprising a connection electrode made of a same electrically conductive film as the lower layer electrode, wherein
the connection electrode is in contact with the drain electrode within the first contact hole, the upper layer electrode being in contact with the connection electrode.

8. The active matrix substrate of claim 1, further comprising:
a gate insulating layer provided between the semiconductor layer and the gate electrode; and
a second interlayer insulating layer provided so as to cover the gate electrode or the semiconductor layer, wherein,
between the gate insulating layer and the second interlayer insulating layer, at least the second interlayer insulating layer has a second contact hole formed therein through which a portion of the semiconductor layer is exposed, the second contact hole allowing the drain electrode to be electrically connected to the semiconductor layer; and
when viewed from the normal direction of the substrate, at least a portion of the second contact hole overlaps the first contact hole.

9. The active matrix substrate of claim 8, wherein, when viewed from the normal direction of the substrate, a center of the first contact hole and a center of the second contact hole are deviated.

10. The active matrix substrate of claim 1, wherein the upper layer electrode and the lower layer electrode are each made of a transparent electrically conductive material.

11. The active matrix substrate of claim 1, wherein a width of the first aperture along the first direction is smaller than a width of the second aperture along the first direction.

12. A liquid crystal display device comprising:
the active matrix substrate of claim 1;
a counter substrate provided opposite from the active matrix substrate; and
a liquid crystal layer proved between the active matrix substrate and the counter substrate.

13. The liquid crystal display device of claim 12 having a plurality of pixels in a matrix arrangement, wherein
the upper layer electrode functions as a pixel electrode.

14. The liquid crystal display device of claim 13, wherein the upper layer electrode has a plurality of slits.

15. The liquid crystal display device of claim 12, wherein the lower layer electrode, the dielectric layer, and the upper layer electrode constitute a storage capacitor.

16. A method of producing an active matrix substrate including:
a thin film transistor including a semiconductor layer, a gate electrode, a source electrode, and a drain electrode;
a scanning line provided so as to extend substantially parallel to a first direction, and electrically connected to the gate electrode of the thin film transistor; and
a signal line provided so as to extend substantially parallel to a second direction orthogonal to the first direction, and electrically connected to the source electrode of the thin film transistor, the method comprising:
step (A) of forming the thin film transistor on a substrate;
step (B) of forming an interlayer insulating layer covering the thin film transistor, the interlayer insulating layer having a first aperture;
step (C) of forming a lower layer electrode on the interlayer insulating layer;
step (D) of forming on the lower layer electrode a dielectric layer having a second aperture; and
step (E) of forming on the dielectric layer an upper layer electrode overlapping at least a portion of the lower layer electrode via the dielectric layer, the upper layer electrode being electrically connected to the drain electrode in a contact hole, the contact hole including the first aperture and the second aperture,
wherein,
step (B) and step (D) are performed so that a width of the first aperture along one of the first direction and the second direction is smaller than a width of the second aperture along the one direction, and that, when viewed from a normal direction of the substrate, a portion of the contour of the second aperture is located inside the contour of the first aperture.

* * * * *